United States Patent
Tsai et al.

(10) Patent No.: US 11,232,975 B2
(45) Date of Patent: Jan. 25, 2022

(54) SEMICONDUCTOR-ON-INSULATOR (SOI) SUBSTRATE HAVING DIELECTRIC STRUCTURES THAT INCREASE INTERFACE BONDING STRENGTH

(71) Applicant: Taiwan Semiconductor Manufacturing Co., Ltd., Hsin-Chu (TW)

(72) Inventors: Min-Ying Tsai, Kaohsiung (TW); Yeur-Luen Tu, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 213 days.

(21) Appl. No.: 16/227,183

(22) Filed: Dec. 20, 2018

(65) Prior Publication Data

US 2020/0098618 A1 Mar. 26, 2020

Related U.S. Application Data

(60) Provisional application No. 62/736,581, filed on Sep. 26, 2018.

(51) Int. Cl.
*H01L 21/762* (2006.01)
*H01L 27/12* (2006.01)

(52) U.S. Cl.
CPC .... *H01L 21/76256* (2013.01); *H01L 27/1203* (2013.01)

(58) Field of Classification Search
CPC .............. H01L 21/76256; H01L 27/1203
USPC ........................................... 257/347
See application file for complete search history.

(56) References Cited

U.S. PATENT DOCUMENTS

| | | | |
|---|---|---|---|
| 5,453,394 A | 9/1995 | Yonehara | |
| 5,876,497 A | 3/1999 | Atoji | |
| 6,103,009 A | 8/2000 | Atoji | |
| 2004/0137698 A1 | 7/2004 | Taraschi | |
| 2008/0248629 A1* | 10/2008 | Yamazaki | H01L 21/0234 438/458 |

(Continued)

OTHER PUBLICATIONS

U.S. Appl. No. 16/580,259, filed Sep. 24, 2019.

(Continued)

*Primary Examiner* — Lex H Malsawma
*Assistant Examiner* — Xia L Cross
(74) *Attorney, Agent, or Firm* — Eschweiler & Potashnik, LLC

(57) ABSTRACT

Various embodiments of the present application are directed to a method for forming a semiconductor-on-insulator (SOI) substrate without bond interface voids and/or without delamination between layers. In some embodiments, a first high κ bonding structure is formed over a handle substrate. A device layer is formed over a sacrificial substrate. Outer most sidewalls of the device layer are between outer most sidewalls of the sacrificial substrate. A second high κ bonding structure is formed over the device layer. The first high κ bonding structure is bonded to the second high κ bonding structure, such that the device layer is between the sacrificial substrate and the handle substrate. A first removal process is performed to remove the sacrificial substrate. The first removal process comprises performing a first etch into the sacrificial substrate until the device layer is reached.

20 Claims, 16 Drawing Sheets

(56) References Cited

U.S. PATENT DOCUMENTS

| | | | | |
|---|---|---|---|---|
| 2008/0280420 A1* | 11/2008 | Yamazaki | ............ | H01L 21/302 |
| | | | | 438/458 |
| 2008/0296724 A1* | 12/2008 | Yamazaki | ............... | H01L 21/84 |
| | | | | 257/506 |
| 2010/0096720 A1 | 4/2010 | Ohnuma et al. | | |
| 2011/0012131 A1* | 1/2011 | Yamazaki | ............... | H01L 21/84 |
| | | | | 257/77 |
| 2014/0252446 A1* | 9/2014 | Bedell | ................. | H01L 27/1203 |
| | | | | 257/316 |
| 2016/0380101 A1* | 12/2016 | Mason | ................ | H01L 29/7838 |
| | | | | 257/348 |
| 2019/0198814 A1* | 6/2019 | Ge | ......................... | B01D 53/28 |

OTHER PUBLICATIONS

Janwaskar, Suhanshu; "SOI Silicon on Insulator Technology"; Slideshow; Dec. 9, 2017; https://www.slideshare.net/shudhanshu29/silicon-on-insulator-soi-technology?from_action=save.

"Smart Cut"; Wikipedia Article; Published May 6, 2019; https://en.wikipedia.org/wiki/Smart_cut.

Notice of Allowance dated Nov. 12, 2020 in connection with U.S. Appl. No. 16/580,259 f.

\* cited by examiner

SEMICONDUCTOR-ON-INSULATOR (SOI) SUBSTRATE HAVING DIELECTRIC STRUCTURES THAT INCREASE INTERFACE BONDING STRENGTH

REFERENCE TO RELATED APPLICATION

This Application claims priority to U.S. Provisional Application No. 62/736,581, filed on Sep. 26, 2018, the contents of which are hereby incorporated by reference in their entirety.

BACKGROUND

Integrated circuits have traditionally been formed on bulk semiconductor substrates. In recent years, semiconductor-on-insulator (SOI) substrates have emerged as an alternative to bulk semiconductor substrates. An SOI substrate comprises a handle substrate enclosed by a first bonding structure, and a device layer overlying a second bonding structure where the first bonding structure is bonded to the second bonding structure. Among other things, an SOI substrate leads to reduced parasitic capacitance, reduced leakage current, reduced latch up, and improved semiconductor device performance (e.g., lower power consumption and higher switching speed).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
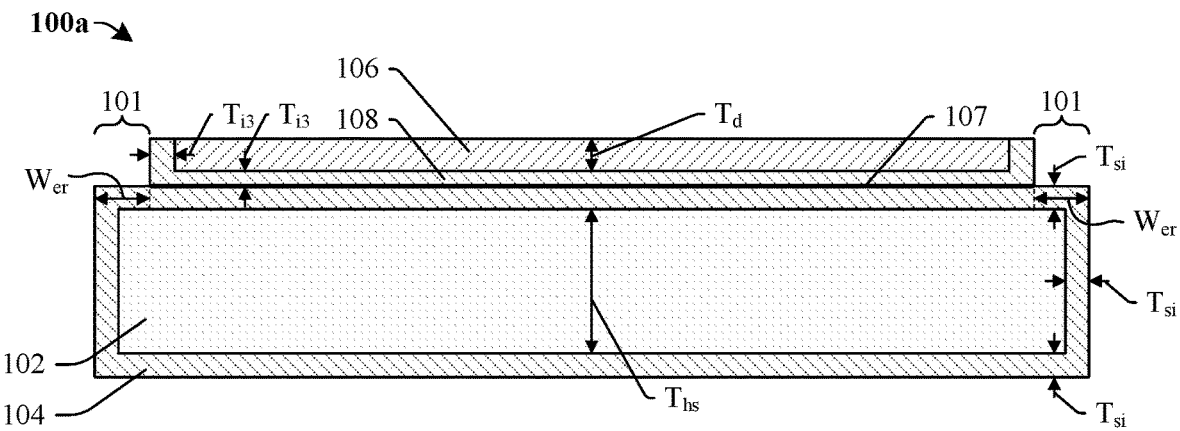
FIG. 1A illustrates a cross-sectional view of some embodiments of a semiconductor-on-insulator (SOI) substrate with a first high κ bonding structure and a second high κ bonding structure, according to the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to a method for forming a semiconductor-on-insulator (SOI) substrate, a handle substrate is oxidized to form a first oxide layer (e.g., $SiO_2$) surrounding the handle substrate. A device layer is formed over a sacrificial substrate. The device layer has a significantly lower doping concentration than the sacrificial substrate. A second oxide layer (e.g., $SiO_2$) is formed over the device layer. The handle substrate is bonded to the sacrificial substrate through the first and second oxide layers such that the device layer is between the first and second oxide layers and the sacrificial substrate. The first oxide layer and the second oxide layer meet at a bond interface, such that the bond interface comprises a $SiO_2$—$SiO_2$ bond. A removal process is performed to remove the sacrificial substrate and expose an upper surface of the device layer. The removal process includes a grinding process, an etch process, and a chemical mechanical polish (CMP). The CMP is performed to flatten the device layer of the SOI substrate. A portion of the second oxide layer remains over the handle substrate and defines an insulator layer of the SOI substrate.

A challenge with the method is in a low interfacial adhesion energy (e.g., less than approximately 3 $J/m^2$) of the bond interface, specifically due to the $SiO_2$—$SiO_2$ bond. Voids (e.g., empty space) may occur at the bond interface after bonding the first and second oxide layers together due to the low interfacial adhesion energy. Additionally, during the removal process, the second oxide layer is removed from sidewalls of the device layer and the sacrificial substrate, exposing an interface between the two layers. Further, the etch process may involve using an etchant such as hydrofluoric, acid, nitric acid, and acetic acid (HNA) and/or diluted hydrofluoric acid (DHF). The etchant may cause delamination to occur between the second oxide layer and the device layer. Furthermore, the etchant (e.g., DHF) may cause voids and/or delamination to occur at the bond interface due to the low interfacial adhesion energy. Additionally, the low interfacial adhesion energy of the bond interface may be susceptible to damage (e.g., interfacial voids and/or delamination) from subsequent manufacturing steps such as a front end of line (FEOL) process and/or a back end of line process (BEOL) performed on/over the SOI substrate. The interfacial voids and/or delamination at the bond interface may cause device failure and/or change electrical properties of electronics disposed on/over the SOI substrate.

Various embodiments of the present application are directed towards an improved method for manufacturing an SOI substrate to improve an endurance, strength, and stability of the SOI substrate. Various embodiments of the improved method include forming a first bonding structure (e.g., a high κ material such as $Al_2O_3$) around a handle substrate and a second bonding structure (e.g., the high κ material) around a device layer and a sacrificial substrate. The first and second bonding structures can each be formed with low temperature deposition (e.g. 300 degrees Celsius or less) and strong film uniformity. The first bonding structure is bonded to the second bonding structure at a bond interface such that the device layer is between the first and second bond structures and the sacrificial substrate. Thus, the bond interface comprises a high κ-high κ bond. The high κ-high κ bond has higher interfacial adhesion energy compared to a $SiO_2$—$SiO_2$ bond (e.g., greater than four times interfacial adhesion energy and/or approximately 12 J/m$^2$) providing a strong bond interface without bond voids. A removal process is performed to remove the sacrificial substrate and expose an upper surface of the device layer. The removal process includes an etch process, and further comprises a grinding process and/or a chemical mechanical polish (CMP).

The high κ material is resistive to the etch process(es) during the removal process (e.g., a hydrofluoric acid/nitric acid (HNA) etch or a hydrofluoric acid (HF) etch). The second bonding structure encloses outer sidewalls of the device layer throughout the removal process, preventing an interface between the second bonding structure and the device layer from delaminating and/or forming voids. Therefore, delamination does not occur at the interface between the device layer and the second bonding structure because of the high κ material. Additionally, the high κ material and/or the high κ-high κ bond is resistive to proceeding manufacturing steps (e.g., a FEOL process and/or a BEOL process) such that voids do not exist in the high κ-high κ bond after the proceeding manufacturing steps, thereby protecting the bond interface and improving an endurance, strength, and stability of the SOI substrate.

Referring to FIG. 1A, a cross-sectional view of a SOI substrate 100a in accordance with some embodiments is provided.

The SOI substrate 100a includes a handle substrate 102, a first insulator layer 104 (in some embodiments, referred to as a first bonding structure), a device layer 106, and a second insulator layer 108 (in some embodiments, referred to as a second bonding structure). The SOI substrate 100a may, for example, be used with bipolar complementary metal-oxide-semiconductor (CMOS) double-diffused metal-oxide-semiconductor (DMOS) (BCD) applications, embedded flash (eFlash) applications, CMOS image sensor (CIS) applications, near infrared (NIR) applications, microelectronics applications, optoelectronics applications, micro-electro-mechanicals systems (MEMS) applications and other applications. In some embodiments, the SOI substrate 100a has a circular top layout and/or has a diameter of approximately 200, 300, or 450 millimeters. In other embodiments, the SOI substrate 100a has some other shape and/or some other dimensions. Further, in some embodiments, the SOI substrate 100a is a semiconductor wafer.

The first and second insulator layers 104, 108 directly contact at a bond interface 107 such that material of the first insulator layer 104 is bonded to material of the second insulator layer 108. The bond interface 107 comprises a high κ-high κ bond between the first and second insulator layers 104, 108. In various embodiments, the high κ-high κ bond is an $Al_2O_3$—$Al_2O_3$ bond. In some embodiments, the bond interface 107 is absent of any voids. In various embodiments, the bond interface 107 has a strong interfacial adhesion energy that is at least four times greater than an interfacial adhesion energy of a silicon oxide-silicon oxide bond. In various embodiments, the strong interfacial adhesion energy of the bond interface 107 is approximately 12 J/m$^2$. The strong interfacial adhesion energy may, for example, prevent the bond interface 107 from being compromised and/or damaged by subsequent processing steps such as a FEOL and/or BEOL process to form CMOS devices and/or an interconnect structure on/over the device layer 106. Additionally, a high κ material of the first and second insulator layers 104, 108 may, for example, protect interfaces of the first and second insulator layers 104, 108 from being damaged (e.g., delamination and/or formation of voids) by the subsequent processing steps. In some embodiments, the interfaces may, for example, include an interface between the device layer 106 and the second insulator 108 and/or an interface between a perimeter of the handle substrate and an inner surface of the first insulator layer 104. The subsequent processing steps may, for example, comprise etching processes that include use of an HNA etchant, an HF etchant, and/or a DHF etchant. The strong interfacial adhesion energy of the bond interface 107 may, for example, not react to the HNA, DHF, and/or HF etchant(s). Therefore, voids and/or dislocation may not occur at the bond interface 107 and/or at layer interfaces of the first and second insulator layers 104, 108. Thus, use of the high κ-high κ bond and the high κ material may increase an endurance, strength, and stability of the SOI substrate 100a.

In some embodiments, the handle substrate 102 has a high resistance and/or a low oxygen concentration. The high resistance may, for example, be greater than approximately 1, 3, 4, or 9 kilo-ohms/centimeter (kΩ/cm), and/or may, for example, be approximately 1-4 kΩ/cm, approximately 4-9 kΩ/cm, or approximately 1-9 kΩ/cm. The low oxygen concentration may, for example, be less than approximately 1, 2, or 5 parts per million atoms (ppma), and/or may, for example, be between approximately 0.1-2.5 ppma, approximately 2.5-5.0 ppma, or approximately 0.1-5.0 ppma. The low oxygen concentration and the high resistance individually reduce substrate and/or radio frequency (RF) losses. In some embodiments, the handle substrate 102 has a low resistance. The low resistance reduces costs of the handle substrate 102 but may lead to increased substrate and/or RF losses. The low resistance may, for example, be less than approximately 8, 10, or 12 Ω/cm, and/or may, for example, be between approximately 8-12 Ω/cm, approximately 8-10 Ω/cm, or approximately 10-12 Ω/cm. In some embodiments, the handle substrate 102 is doped with p-type or n-type dopants. The resistance of the handle substrate 102 may, for example, be controlled by a doping concentration of the handle substrate 102. For example, increasing the doping concentration may decrease resistance, whereas decreasing the doping concentration may increase resistance, or vice versa. In some embodiments, outer sidewalls of the second insulator layer 108 are between outer sidewalls of the first insulator layer 104 such that an edge region 101 exists between the aforementioned outer sidewalls. In various embodiments, a width $W_{er}$ of the edge region 101 may, for example, be approximately 0.8-1.2 millimeters, approximately 0.8-1.0 millimeters, or approximately 1.0-1.2 millimeters. In some embodiments, a thickness $T_{hs}$ of the handle substrate 102 is approximately 720-780 micrometers.

The first insulator layer 104 overlies the handle substrate 102 and may, for example, be or comprise a first material such as a high κ dielectric, aluminum oxide (e.g., $Al_2O_3$), or the like. As used herein, a high κ dielectric may be or comprise, for example, a dielectric with a dielectric constant κ greater than approximately 3.9, 9.9, 9.34, or 11.54. In various embodiments, the first material is a dielectric layer with a resistivity ρ, a thermal conductivity λ, and a band gap. In various embodiments, the resistivity ρ may, for example, be in a range of approximately $10^{12}$-$10^{14}$ Ω*cm. In various embodiments, the thermal conductivity λ may, for example, be in a range of approximately 0.3-30 W/(cm*K). In various embodiments, the band gap may, for example, be 8.8 eV, or in a range of approximately 8.8-9.2 eV. In various embodiments, the first material has an electrical resistivity, a thermal conductivity, and a bandgap comparable to silicon oxide ($SiO_2$). In various embodiments, an electrical resistivity, a thermal conductivity, and a bandgap comparable to silicon oxide may, for example, be within approximately 1 percent, approximately 5 percent, approximately 10 percent, or within a range of approximately 0-10 percent of silicon oxide. For example, if silicon oxide has a bandgap of 9 eV then a material with a comparable bandgap value may have a bandgap within a range of approximately 8.1-9.9 eV. In some embodiments, the first material having properties (e.g., an electrical resistivity, a thermal conductivity, and a bandgap) comparable to silicon oxide may, for example, mitigate redesign of a technology disposed upon the SOI substrate 100a because the technology may have matured with silicon oxide.

In some embodiments, the first insulator layer 104 surrounds and/or encloses the handle substrate 102. In various embodiments, the first insulator layer 104 is formed with uniform or substantially uniform thickness around an outer perimeter of the handle substrate 102. In some embodiments, a variation of a thickness of the first insulator layer 104 around the outer perimeter of the handle substrate 102 is less than approximately 2 percent. In various embodiments, the first insulator layer 104 is formed to a thickness $T_{si}$ of approximately 20 or 15 nanometers (nm), is formed to a thickness $T_{si}$ less than approximately 15 or 20 nm, or is formed within a range of approximately 0.1-15 nm or approximately 0.1-20 nm. In various embodiments, when the thickness $T_{si}$ is less than approximately 15 nm the SOI substrate 100a, may, for example, be used in a fully depleted SOI application. In various embodiments, the thickness $T_{si}$ is large so as to provide a high degree of electrical insulation between the handle substrate 102 and the device layer 106. The high degree of electrical insulation may, for example, enable reduced leakage current between devices (not shown) on the device layer 106 and/or may, for example, enhance performance of the devices.

The second insulator layer 108 underlies the device layer 106 and may, for example, be or comprise a second material such as a high κ dielectric, aluminum oxide (e.g., $Al_2O_3$), or the like. In some embodiments, the first material and the second material are the same, have the same thicknesses, have similar electrical resistivity, have similar thermal conductivity, and have similar bandgaps, or any combination of the foregoing. In some embodiments, the second insulator layer 108 surrounds and/or encloses a portion of the device layer 106 in such a way that an upper surface of the device layer 106 is exposed. In various embodiments, the second insulator layer 108 is formed with uniform thickness $T_{i3}$ around a lower surface of the device layer 106 and sidewalls of the device layer 106. In some embodiments, a variation of the thickness $T_{i3}$ of the second insulator layer 108 around the lower surface of the device layer 106 and the sidewalls of the device layer 106 is less than approximately 2 percent. In various embodiments, the thickness $T_{i3}$ is approximately 20 or 15 nm, is less than approximately 15 or 20 nm, or is within a range of approximately 0.1-15 nm or approximately 0.1-20 nm. In various embodiments, when the thickness $T_{i3}$ is less than approximately 15 nm the SOI substrate 100a, may, for example, be used in a fully depleted SOI application. In various embodiments, the thickness $T_{i3}$ is approximately equal to the thickness $T_{si}$. In various embodiments, an upper surface of the second insulator 108 is aligned with the upper surface of the device layer 106.

In some embodiments total thickness variation (TTV) of the first and second insulator layers 104, 108 is low. The TTV may, for example, be the difference between a smallest thickness value across the first insulator layer 104 and a largest thickness value across the first insulator layer 104. A low TTV, for example, may correspond to less than a two percent variation in TTV across the outer surface of the first and second insulator layers 104, 108. In some embodiments, the first and second insulator layers 104, 108 are formed with a low temperature (e.g., less than approximately 300 degrees Celsius) atomic layer deposition process (ALD) to achieve the low TTV. In some embodiments, a substantially uniform thickness may, for example, correspond to less than a two percent variation in thickness across the outer surface of the first and second insulator layers 104, 108.

The device layer 106 overlies the second insulator layer 108 and may, for example, be or comprise monocrystalline silicon, some other silicon, some other semiconductor material, or any combination of the foregoing. In some embodiments, the device layer 106 and the handle substrate 102 are the same semiconductor material (e.g., monocrystalline silicon). In some embodiments, the device layer 106 has a thickness $T_d$ that is large. The large thickness of the device layer 106 may, for example, enable formation of large semiconductor junctions (e.g., PN junctions) upon which certain devices (e.g., NIR image sensors) may depend. In some embodiments, the thickness $T_d$ of the device layer 106 is large in that it is greater than approximately 0.2, 0.3, 1.0, 5.0, or 8.0 micrometers, and/or in that it is approximately 0.2-8.0 micrometers, approximately 0.2-4.0 micrometers, or approximately 4.0-8.0 micrometers. In some embodiments, the thickness $T_d$ of the device layer 106 is less than approximately 0.2 micrometers and/or within a range of approximately 0.05-0.2 micrometers.

Figure 1B:
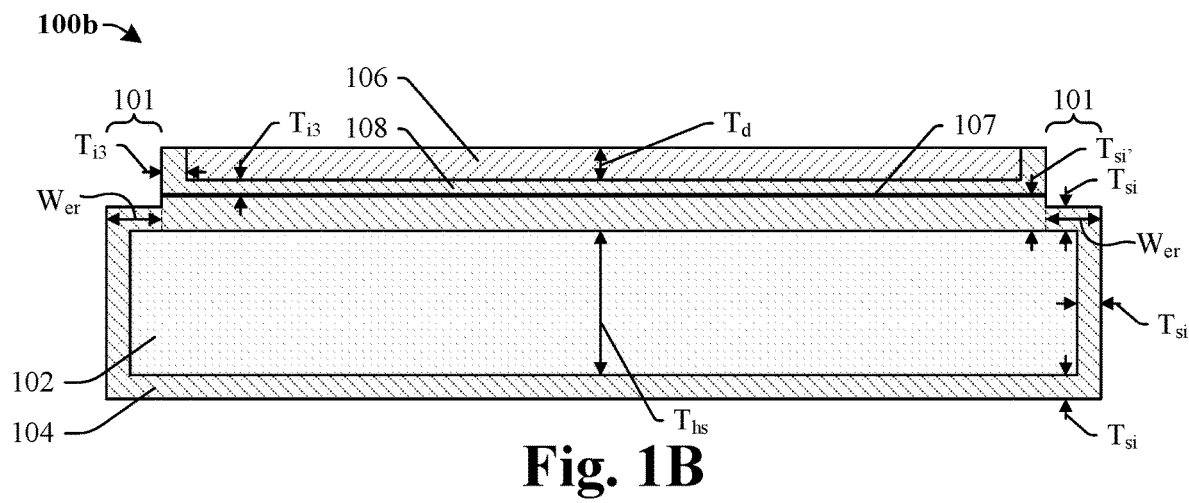
FIGS. 1B and 1C illustrate cross-sectional views of various alternative embodiments of the SOI substrate of FIG. 1A, according to the present disclosure.

Referring to FIG. 1B, a cross-sectional view of a SOI substrate 100b in accordance with some alternative embodiments of the SOI substrate 100a of FIG. 1A is provided in which the first insulator layer 104 has two discrete thicknesses above the upper surface of the handle substrate 102. The first insulator layer 104 has a raised center thickness $T_{si'}$ that is greater than the thickness $T_{si}$. In various embodiments, the two discrete thicknesses are due to a removal process removing a portion of the first insulator layer 104.

Figure 1C:
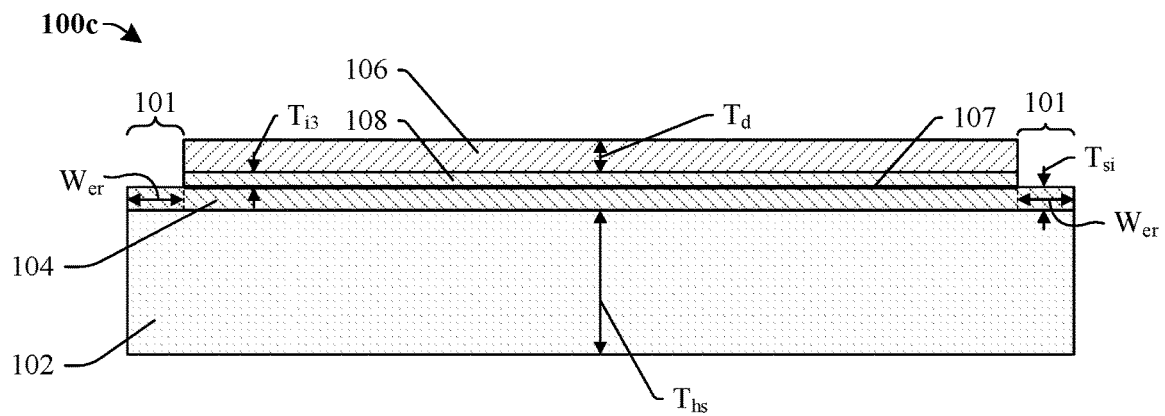

Referring to FIG. 1C, a cross-sectional view of a SOI substrate 100c in accordance with some alternative embodiments of the SOI substrate 100a of FIG. 1A is provided in which outer sidewalls of the first insulator layer 104 are aligned with outer sidewalls of the handle substrate 102. Further, outer sidewalls of the second insulator layer 108 are aligned with outer sidewalls of the device layer 106.

Figure 2A:
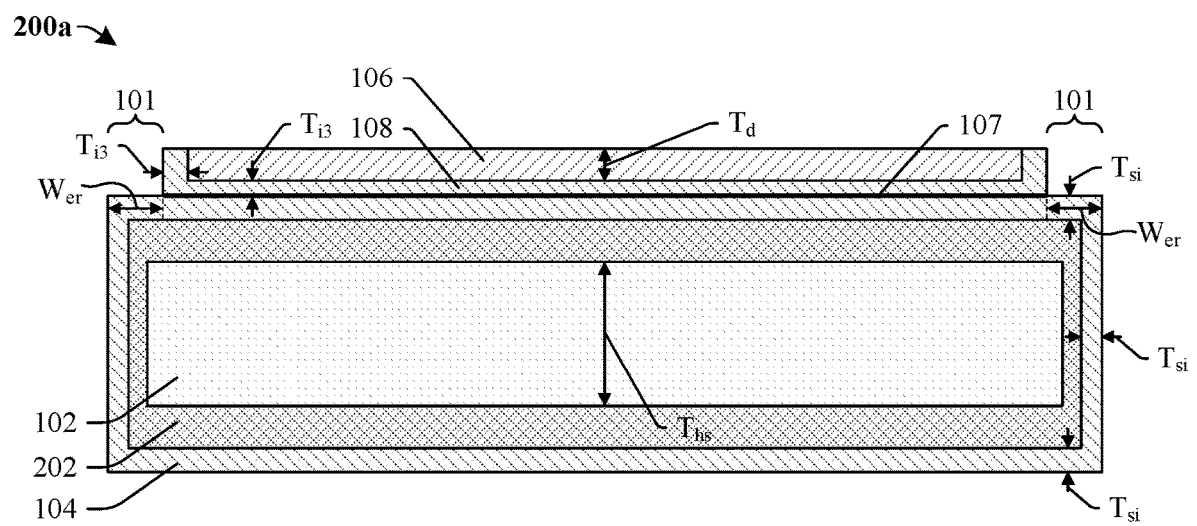
FIGS. 2A-2D illustrate cross-sectional views of various alternative embodiments of the SOI substrate of FIG. 1A in which a bottom dielectric layer is disposed between a handle substrate of the SOI substrate and the first and second high κ bonding structures, according to the present disclosure.

Referring to FIG. 2A, a cross-sectional view of a SOI substrate 200a in accordance with some alternative embodiments of the SOI substrate 100a of FIG. 1A is provided in which a bottom dielectric layer 202 encloses the handle substrate 102 and the first insulator layer 104 encloses the bottom dielectric layer 202. In various embodiments, the bottom dielectric layer 202 may be or comprise, for example, silicon oxide, silicon-rich oxide (SRO), some other oxide, some other dielectric, or any combination of the foregoing. In various embodiments, the bottom dielectric layer 202 has a dielectric constant that is at least half of a dielectric constant of the first and second insulator layers 104, 108. In various embodiments, the bottom dielectric layer 202 is a different material than both the first and second insulator layers 104, 108. The SOI substrate 200a may, for example, be used with high voltage devices, BCD devices, eFlash devices, CMOS image sensors, NIR image sensors, and other devices. The high voltage devices may, for example, be devices operating at voltages greater than approximately 100 volts. The bottom dielectric layer 202 is configured to act as an insulator to mitigate mechanical damage to the handle substrate 102. For example, while operating at high voltages the bottom dielectric layer 202 mitigates delamination of the handle substrate 102 from layers above and/or below. In various embodiments, the thickness $T_{i3}$ and the thickness $T_{si}$ are less than approximately 20 nm. The thickness $T_{i3}$ and the thickness $T_{si}$ are formed to a suitable thickness in order to prevent damage from etchants (e.g., HNA, DHF, and/or HF etchant(s)) during formation of the SOI substrate 200a, while remaining thin enough to reduce processing costs. In some embodiments, the thickness $T_d$ of the device layer 106 is formed to a suitable thickness depending on the high voltage device (e.g., the thickness $T_d$ may be within a range of 1 to 3 micrometers).

In some embodiments, the first and second insulator layers 104, 108 have the same or substantially the same electrical resistivities, thermal conductivities, and band gaps as those of the bottom dielectric layer 202. In some embodiments, the first and second insulator layers 104, 108 have dielectric constants that are greater than that of the bottom dielectric layer 202 and/or are two or more times greater than that of the bottom dielectric layer 202. These embodiments pertaining to dielectric constants, electrical resistivities, etc. may, for example, also arise when the bottom dielectric layer 202 is or comprise silicon oxide.

Figure 2B:
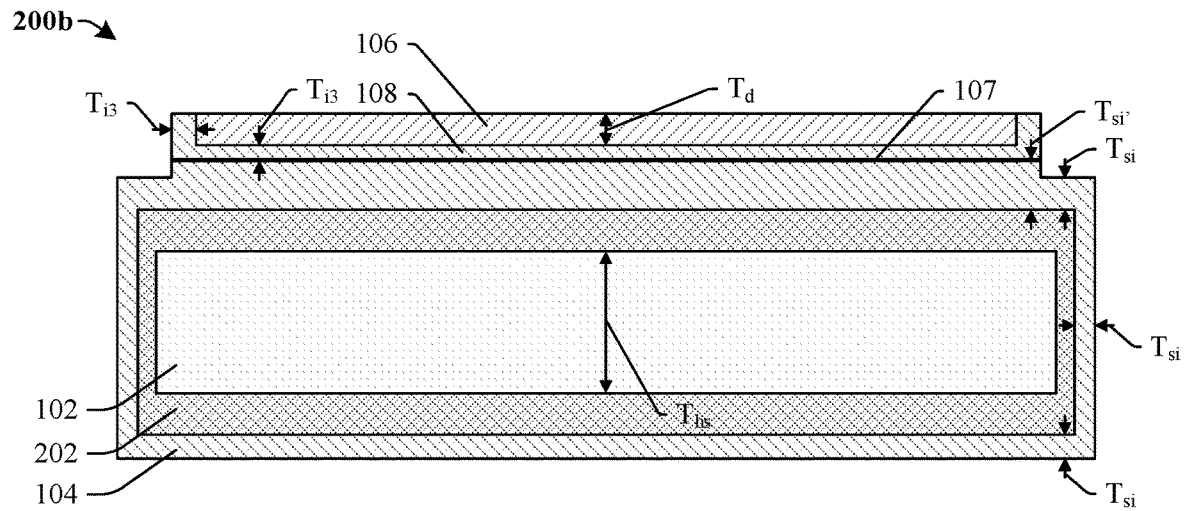

Referring to FIG. 2B, a cross-sectional view of a SOI substrate 200b in accordance with some alternative embodiments of the SOI substrate 200a of FIG. 2A is provided in which the first insulator layer 104 has two discrete thicknesses above an upper surface of the bottom dielectric layer 202. The first insulator layer 104 has a raised center thickness $T_{si'}$ that is greater than the thickness $T_{si}$. In various embodiments, the two discrete thicknesses are due to a removal process removing a portion of the first insulator layer 104.

Figure 2C:
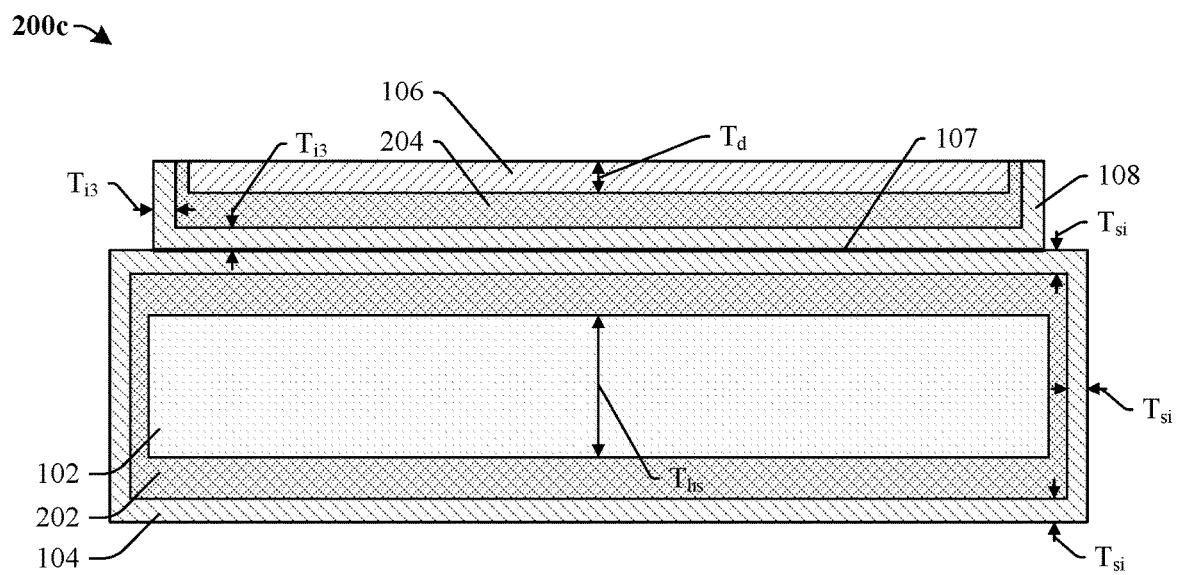

Referring to FIG. 2C, a cross-sectional view of a SOI substrate 200c in accordance with some alternative embodiments of the SOI substrate 200b of FIG. 2A is provided in which a top dielectric layer 204 encloses a portion of the device layer 106 and the second insulator layer 108 partially encloses the top dielectric layer 204. In various embodiments, an upper surface of the top dielectric layer 204 is aligned with the upper surface of the device layer 106. In various embodiments, the top dielectric layer 204 may be or comprise, for example, silicon oxide, silicon-rich oxide (SRO), some other oxide, some other dielectric, or any combination of the foregoing. In various embodiments, the top dielectric layer 204 has a dielectric constant that is less than each of a dielectric constant of the first and second insulator layers 104, 108. In various embodiments, the top dielectric layer 204 is a different material than both the first and second insulator layers 104, 108. In various embodiments, the top dielectric layer 204 is a same material as the bottom dielectric layer 202.

In some embodiments, the first and second insulator layers 104, 108 have the same or substantially the same electrical resistivities, thermal conductivities, and band gaps as those of the bottom dielectric layer 202 and/or those of the top dielectric layer 204. In some embodiments, the first and second insulator layers 104, 108 have dielectric constants that are greater than that of the bottom dielectric layer 202 and/or are two or more times greater than that of the bottom dielectric layer 202. Further, in some embodiments, the first and second insulator layers 104, 108 have dielectric constants that are greater than that of the top dielectric layer 204 and/or are two or more times greater than that of the top dielectric layer 204. These embodiments pertaining to dielectric constants, electrical resistivities, etc. may, for example, also arise when the bottom and/or top dielectric layer(s) 202, 204 is/are or comprise(s) silicon oxide.

In some embodiments when the device layer 106 is equal to/less than approximately 100 nm, the top dielectric layer 204 moves the bond interface 107 away from the device layer 106. The top dielectric layer 204 may, for example, prevent particles on the surface of the device layer 106 from forming humps and/or bond bubbling between the first and second insulator layers 104, 108 while forming the bond interface 107. In some embodiments, increasing the thickness of the device layer 106 to approximately greater than 200 nm may, for example, prevent the particles on the surface of the device layer 106 from causing hump and/or bond bubbling in the bond interface 107.

Figure 2D:
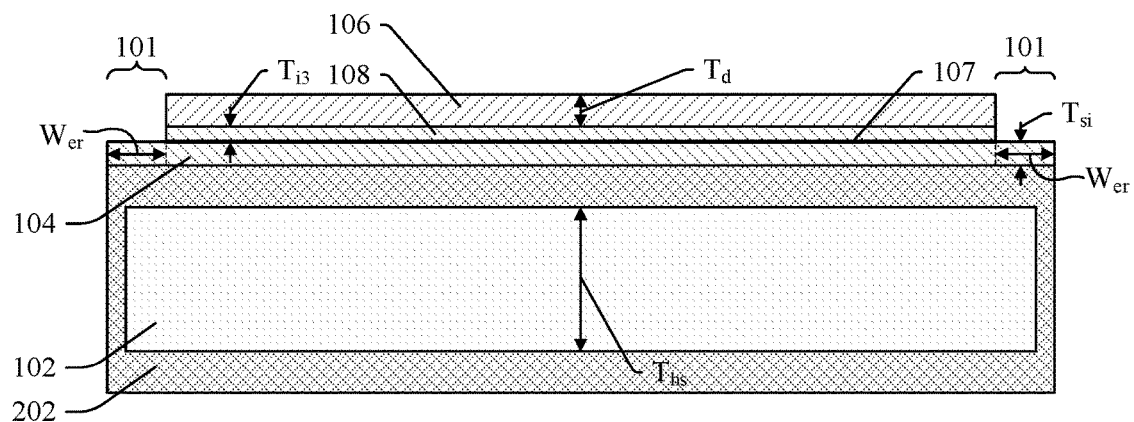

Referring to FIG. 2D, a cross-sectional view of a SOI substrate 200d in accordance with some alternative embodiments of the SOI substrate 200a of FIG. 2A is provided in which outer sidewalls of the first insulator layer 104 are aligned with outer sidewalls of the bottom dielectric layer 202. Further, outer sidewalls of the second insulator layer 108 are aligned with outer sidewalls of the device layer 106.

Figure 3A:
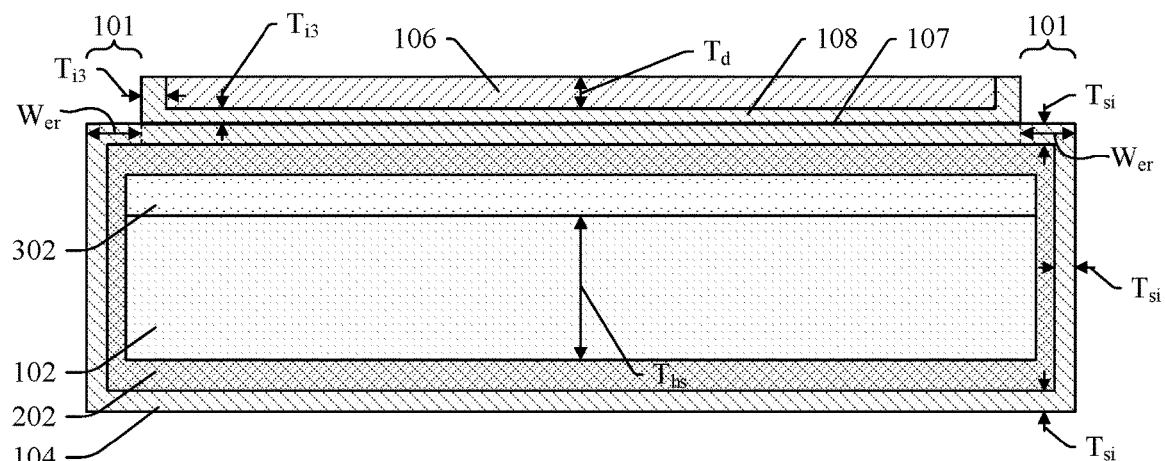
FIGS. 3A-3D illustrate cross-sectional views of various alternative embodiments of the SOI substrate of FIG. 2A in which a trap-rich layer is disposed between the handle substrate and the bottom dielectric layer, according to the present disclosure.

Referring to FIG. 3A, a cross-sectional view of a SOI substrate 300a in accordance with some alternative embodiments of the SOI substrate 200a of FIG. 2A is provided in which a trap-rich layer 302 is disposed between the upper surface of the handle substrate 102 and an inner upper surface of the bottom dielectric layer 202. In various embodiments, the trap-rich layer 302 may be or comprise, for example, polysilicon, some other dielectric, or any combination of the foregoing. In various embodiments, the trap-rich layer 302 enhances the SOI substrate 300a for use with RF applications and other applications by, for example, reducing eddy currents induced by RF signals. In various embodiments, the trap-rich layer 302 may, for example, not comprise any dopants or comprise dopants. In various embodiments, the thickness $T_{i3}$ and the thickness $T_{si}$ are less than approximately 20 nm. The thickness $T_{i3}$ and the thickness $T_{si}$ are formed to a suitable thickness to mitigate damage from etchants (e.g., HNA, DHF, and/or HF etchant(s)) during formation of the SOI substrate 300a. The thickness $T_{i3}$ and the thickness $T_{si}$ are thin enough to reduce processing costs and remain within design constraints for the specific RF application. In some embodiments, the thickness $T_d$ of the device layer 106 is formed to a suitable thickness depending on the RF application (e.g., the thickness $T_d$ may be within a range of 50 to 1000 nanometers).

Figure 3B:
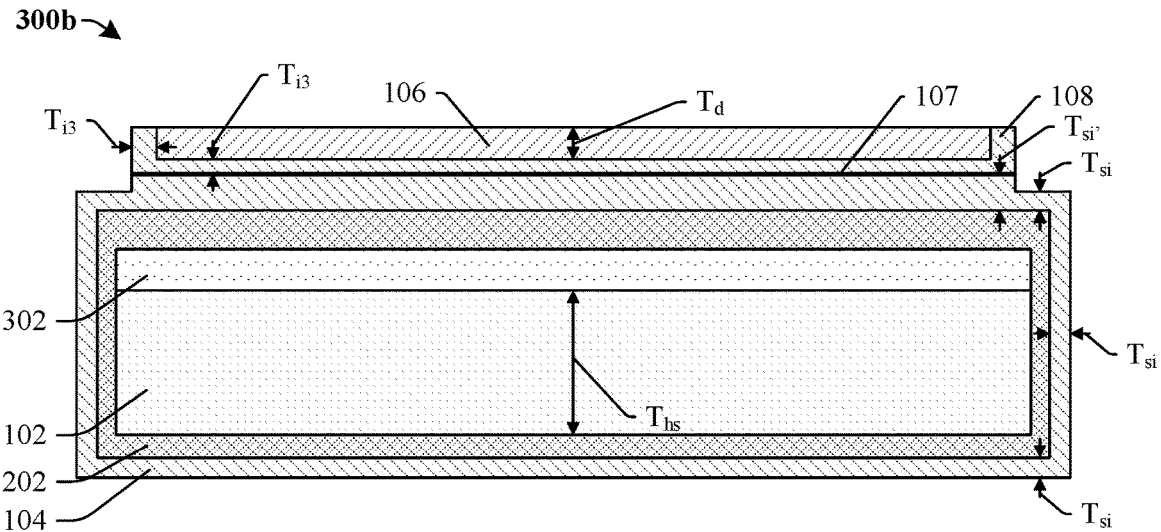

Referring to FIG. 3B, a cross-sectional view of a SOI substrate 300b in accordance with some alternative embodiments of the SOI substrate 300a of FIG. 3A is provided in which the first insulator layer 104 has two discrete thicknesses above an upper surface of the trap-rich layer 302. The first insulator layer 104 has a raised center thickness $T_{si'}$ that is greater than the thickness $T_{si}$. In various embodiments, the two discrete thicknesses are due to a removal process removing a portion of the first insulator layer 104.

Figure 3C:
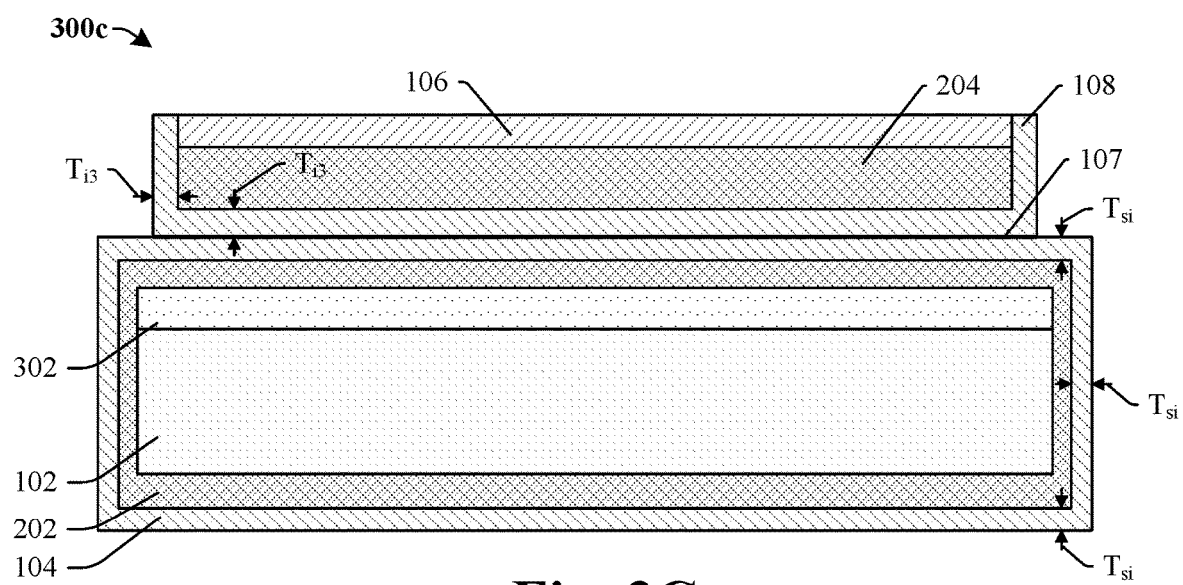

Referring to FIG. 3C, a cross-sectional view of a SOI substrate 300c in accordance with some alternative embodiments of the SOI substrate 300a of FIG. 3A is provided in which a top dielectric layer 204 is disposed between a lower surface of the device layer 106 and a lower inner surface of the second insulator layer 108. In various embodiments, the top dielectric layer 204 has a dielectric constant that is at least half of a dielectric constant of the first and/or second insulator layers 104, 108. In various embodiments, the top dielectric layer 204 may be or comprise, for example, silicon oxide, silicon-rich oxide (SRO), some other oxide, some other dielectric, or any combination of the foregoing. In various embodiments, the top dielectric layer 204 is formed by way of high-density plasma (HDP) chemical vapor deposition.

In some embodiments when the device layer 106 is equal to/less than approximately 100 nm, the top dielectric layer 204 moves the bond interface 107 away from the device layer 106. The top dielectric layer 204 may, for example, prevent particles on the surface of the device layer 106 from forming humps and/or bond bubbling between the first and second insulator layers 104, 108 while forming the bond interface 107. In some embodiments, increasing the thickness of the device layer 106 to approximately greater than 200 nm may, for example, prevent the particles on the surface of the device layer 106 from causing hump and/or bond bubbling in the bond interface 107.

Figure 3D:
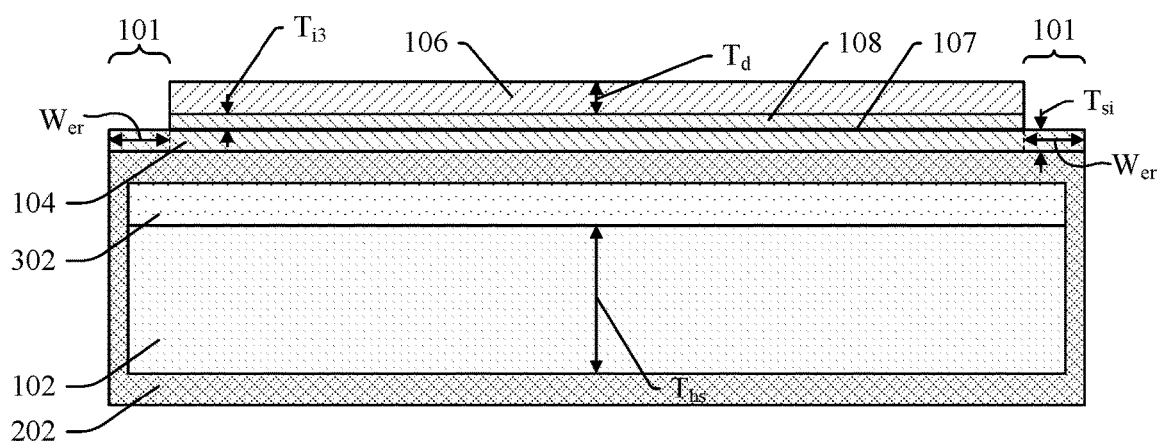

Referring to FIG. 3D, a cross-sectional view of a SOI substrate 300d in accordance with some alternative embodiments of the SOI substrate 300a of FIG. 3A is provided in which outer sidewalls of the first insulator layer 104 are aligned with outer sidewalls of the bottom dielectric layer 202. Further, outer sidewalls of the second insulator layer 108 are aligned with outer sidewalls of the device layer 106.

Figure 4:
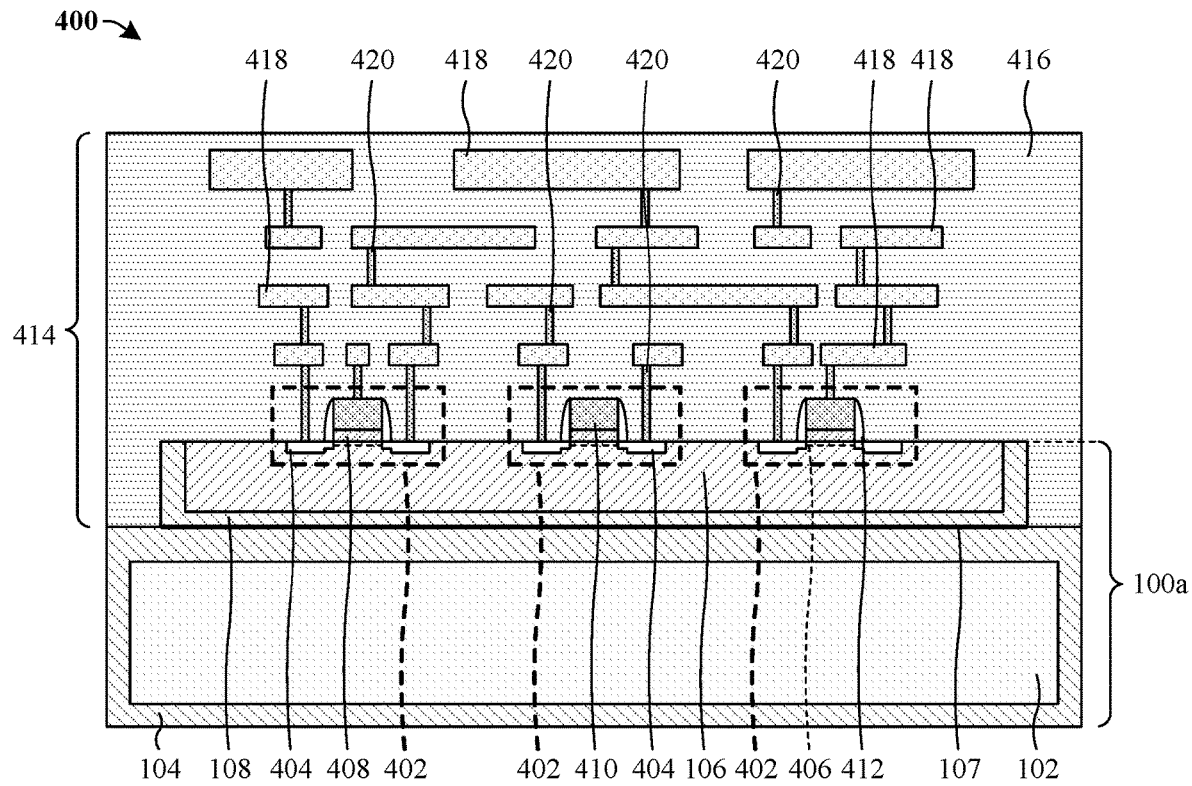
FIG. 4 illustrates a cross-sectional view of some embodiments of a semiconductor structure in which the SOI substrate of FIG. 1A finds application, according to the present disclosure.

Referring to FIG. 4, a cross-sectional view of a semiconductor structure 400 in which the SOI substrate 100a of FIG. 1A finds application in accordance with some embodiments is provided.

The semiconductor structure 400 comprises a plurality of semiconductor devices 402 laterally spaced over the device layer 106. The semiconductor devices 402 may be, for example, be metal-oxide-semiconductor field-effect transistor (MOSFETs), some other metal-oxide-semiconductor (MOS) devices, some other insulated-gate field-effect transistors (IGFETs), some other semiconductor devices, or any combination of the foregoing. Further, the semiconductor devices 402 may be, for example, high voltage devices, BCD devices, eFlash devices, CMOS image sensors, NIR image sensors, some other devices, or any combination of the foregoing.

In some embodiments, the semiconductor devices 402 comprise corresponding source/drain regions 404, corresponding selectively-conductive channels 406, corresponding gate dielectric layers 408, corresponding gate electrodes 410, and corresponding spacers 412. For ease of illustration, only some of the source/drain regions 404 are labeled 404, only one of the selectively-conductive channels 406 is labeled 406, only one of the gate dielectric layers 408 is labeled 408, only one of the gate electrodes 410 is labeled 410, and only one of the spacers 412 is labeled 412. The source/drain regions 404 and the selectively-conductive channels 406 are in the device layer 106. The source/drain regions 404 are respectively at ends of the selectively-conductive channels 406, and each of the selectively-conductive channels 406 extends from one of the source/drain regions 404 to another one of the source/drain regions 404. The source/drain regions 404 have a first doping type and directly adjoin portions of the device layer 106 having a second doping type opposite the first doping type.

The gate dielectric layers 408 respectively overlie the selectively-conductive channels 406, and the gate electrodes 410 respectively overlie the gate dielectric layers 408. The gate dielectric layers 408 may be or comprise, for example, silicon oxide and/or some other dielectric material, and/or the gate electrodes 410 may be or comprise, for example, doped polysilicon, metal, some other conductive material, or any combination of the foregoing. In some embodiments, the gate dielectric layers 408 respectively have a dielectric constant that is less than a dielectric constant of the first insulator layer 104 and/or less than a dielectric constant of the second insulator layer 108. In some embodiments, the gate dielectric layers 408 respectively have a dielectric constant that is half a dielectric constant of the first insulator layer 104 and/or half a dielectric constant of the second insulator layer 108. The spacers 412 overlie the source/drain regions 404 and respectively line sidewalls of the gate electrodes 410 and sidewalls of the gate dielectric layers 408. The spacers 412 may be or comprise, for example, silicon oxide, silicon nitride, silicon oxynitride, silicon carbide, some other dielectric, or any combination of the foregoing. In various embodiments, the gate dielectric layers 408 respectively have a lower dielectric constant than the first insulator layer 104 and/or the second insulator layer 108.

In some embodiments, the first and second insulator layers 104, 108 have the same or substantially the same electrical resistivities, thermal conductivities, and band gaps as those of each gate dielectric layer 408. In some embodiments, the first and second insulator layers 104, 108 have dielectric constants that are greater than that of each gate dielectric layer 408 and/or are two or more times greater than that of each gate dielectric layer 408. These embodiments pertaining to dielectric constants, electrical resistivities, etc. may, for example, also arise when each gate dielectric layer 408 is or comprises silicon oxide.

A back-end-of-line (BEOL) interconnect structure 414 covers the SOI substrate 100a and the semiconductor devices 402. The BEOL interconnect structure 414 comprises an interconnect dielectric layer 416, a plurality of wires 418, and a plurality of vias 420. For ease of illustration, only some of the wires 418 are labeled 418, and only some of the vias 420 are labeled 420. The interconnect dielectric layer 416 may be or comprise, for example, borophosphosilicate glass (BPSG), phosphor-silicate glass (PSG), undoped silicon glass (USG), some other low κ dielectric, silicon oxide, some other dielectric, or any combination of the foregoing. As used herein, a low κ dielectric may be or comprise, for example, a dielectric with a dielectric constant κ less than approximately 3.9, 3, 2, or 1.

The wires 418 and the vias 420 are alternatingly stacked in the interconnect dielectric layer 416 and define conductive paths extending to the semiconductor devices 402. The conductive paths may, for example, electrically couple the semiconductor devices 402 to other devices (e.g., other semiconductor devices), contact pads, or some other structures. The wires 418 and the vias 420 may be or comprise, for example, copper, aluminum copper, aluminum, tungsten, some other metal, or any combination of the foregoing. In some embodiments, topmost wires of the wires 418 are thicker than underlying wires of the wires 418.

Figure 5:
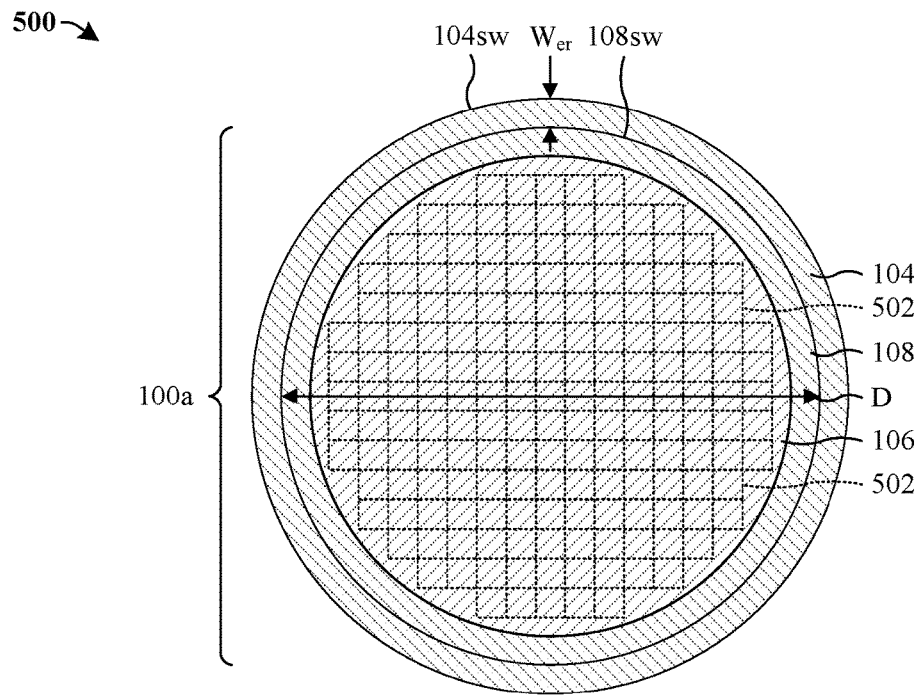
FIG. 5 illustrates a top view of some embodiments of the SOI substrate of FIG. 1A.

Referring to FIG. 5, a top view 500 of the SOI substrate 100*a* of FIG. 1A in accordance with some embodiments is provided.

The SOI substrate 100*a* is circular and comprises a plurality of IC dies 502 arranged in a grid across the device layer 106. For ease of illustration, only some of the IC dies 502 are labeled 502. In some embodiments, a diameter D of the SOI substrate 100*a* is approximately 150, 200, 300, or 450 millimeters. In some embodiments, a sidewall 108*sw* of the second insulator layer 108 is laterally recessed from a sidewall 104*sw* of the first insulator layer 104 by a width $W_{er}$. The width $W_{er}$ may, for example, be approximately 0.8-1.2 millimeters, approximately 0.8-1.0 millimeters, or approximately 1.0-1.2 millimeters.

While FIGS. 4 and 5 are described with regard to embodiments of the SOI substrate 100*a* in FIG. 1A, it is to be understood that embodiments of the SOI substrates 100*b*, 200*a*-200*c*, and 300*a*-300*c* in FIGS. 1B, 2A-2C, and 3A-3C may alternatively be used in FIGS. 4 and 5. While FIG. 4 illustrates a specific layout of the BEOL interconnect structure 414, other layouts of the BEOL interconnect structure 414 are amenable in other embodiments. While FIG. 4 illustrates three semiconductor devices 402 and a specific layout for the semiconductor devices 402, more or less semiconductor devices and/or other layouts for the semiconductor devices 402 is/are amenable. While FIG. 5 illustrates a specific number of IC dies 502 and a specific layout of IC dies 502, more or less IC dies 502 and/or other layouts of IC dies 502 is/are amenable in other embodiments.

FIGS. 6-9, 10A-10E, and 11-15 illustrate cross-sectional views 600-900, 1000*a*-1000*e*, and 1100-1500 of some embodiments of a method of forming and using an SOI substrate with a first high κ bonding structure and a second high κ bonding structure, according to the present disclosure. Although the cross-sectional views 600-900, 1000*a*-1000*e*, and 1100-1500 shown in FIGS. 6-9, 10A-10E, and 11-15 are described with reference to a method, it will be appreciated that the structures shown in FIGS. 6-9, 10A-10E, and 11-15 are not limited to the method but rather may stand alone separate of the method. In some embodiments, FIGS. 6-9, 10A, and 11-15 may, for example, be employed to form the SOI substrate 100*a* of FIG. 1A. Although FIGS. 6-9, 10A-10E, and 11-15 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 6:
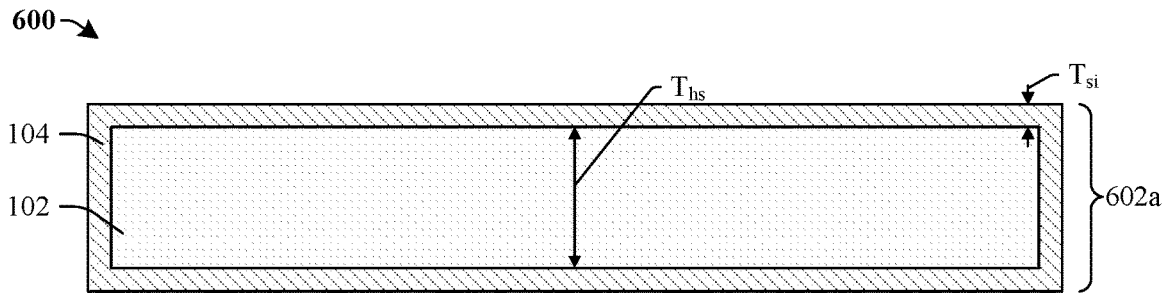
FIGS. 6-9, 10A-10E, and 11-15 illustrate a series of cross-sectional views of some embodiments of a method for forming and using an SOI substrate with a first high κ bonding structure and a second high κ bonding structure, according to the present disclosure.

As illustrated by the cross-sectional view 600 of FIG. 6, a handle substrate 102 is provided. In some embodiments, the handle substrate 102 is or comprises monocrystalline silicon, some other silicon material, some other semiconductor material, or any combination of the foregoing. In some embodiments, the handle substrate 102 is a semiconductor wafer. In some embodiments, the handle substrate 102 has a high resistance and/or a low oxygen concentration. In some embodiments, the handle substrate 102 is doped with p-type or n-type dopants. The resistance of the handle substrate 102 may, for example, be controlled by a doping concentration of the handle substrate 102. In some embodiments, a thickness $T_{hs}$ of the handle substrate 102 is approximately 720-780 micrometers, approximately 720-750 micrometers, or approximately 750-780 micrometers.

Also illustrated by the cross-sectional view 600 of FIG. 6, a first insulator layer 104 is formed on an upper surface of the handle substrate 102 defining a first handle wafer 602*a*. In some embodiments, the first insulator layer 104 completely covers an upper surface of the handle substrate 102. In at least some embodiments where the handle substrate 102 has the high resistance, completely covering the upper surface of the handle substrate 102 may, for example, prevent arcing during plasma processing performed hereafter. In some embodiments, the first insulator layer 104 completely encloses the handle substrate 102. The first insulator layer 104 may, for example, be or comprise a first material such as a high κ dielectric, aluminum oxide (e.g., $Al_2O_3$), or the like. In some embodiments, the first insulator layer 104 is not or does not comprise silicon oxide. In various embodiments, the first insulator layer 104 is formed with a uniform thickness $T_{si}$ around an outer perimeter of the handle substrate 102. In some embodiments, a variation of the thickness $T_{si}$ of the first insulator layer 104 around the outer perimeter of the handle substrate 102 is less than approximately 2 percent. In various embodiments, the thickness $T_{si}$ is approximately 20 or 15 nm, or is formed within a range of approximately 0.1-15 nm or approximately 0.1-20 nm.

In some embodiments, a process for forming the first insulator layer 104 comprises depositing the first insulator layer 104 by thermal oxidation, chemical vapor deposition (CVD), physical vapor deposition (PVD), atomic layer deposition (ALD) some other deposition process, or any combination of the foregoing. For example, the first insulator layer 104 may be formed at temperatures of approximately 300 degrees Celsius, 450 degrees Celsius, and/or less than 450 degrees Celsius. For example, where the first insulator layer 104 is formed by an ALD process, the first insulator layer 104 may be formed at these temperatures. When the first insulator layer 104 is formed by the ALD process at those temperatures, total thickness variation (TTV) of the first insulator layer 104 is low. The TTV may, for example, be the difference between a smallest thickness value across the first insulator layer 104 and a largest thickness value across the first insulator layer 104. A low TTV, for example, may correspond to less than a two percent variation in TTV across the outer surface of the first insulator layer 104.

Figure 7:
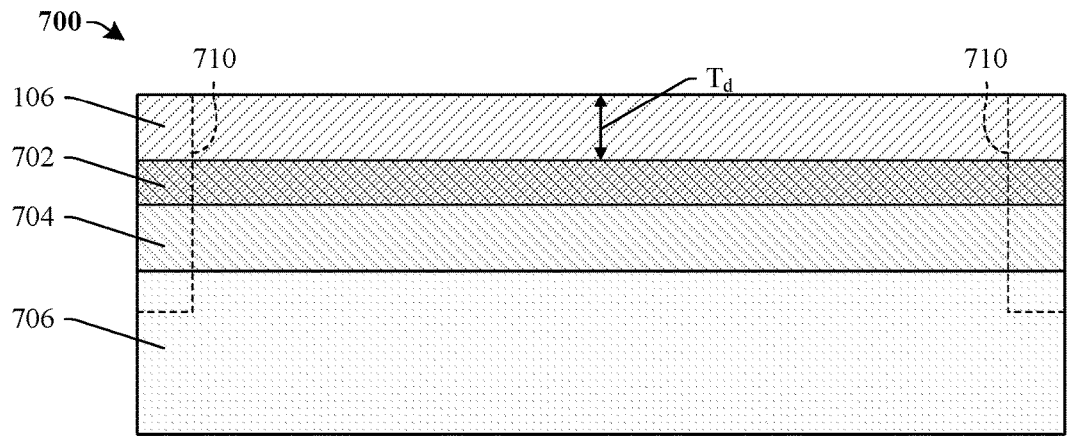

As illustrated by the cross-sectional view 700 of FIG. 7, a sacrificial substrate 706 is provided. In some embodiments, the sacrificial substrate 706 is or comprises monocrystalline silicon, some other silicon material, some other semiconductor material, or any combination of the foregoing. In some embodiments, the sacrificial substrate 706 is doped with p-type or n-type dopants. In some embodiments, the sacrificial substrate 706 has a circular top layout and/or has a diameter of approximately 200, 300, or 450 millimeters. In other embodiments, the sacrificial substrate 706 has some other shape and/or some other dimensions. In some embodiments, the sacrificial substrate 706 is a bulk semiconductor substrate and/or is a semiconductor wafer.

Also illustrated by the cross-sectional view 700 of FIG. 7, a buffer layer 704 is formed over the sacrificial substrate 706. In some embodiments, the buffer layer 704 is or comprises monocrystalline silicon, some other silicon material, some other semiconductor material, or any combination of the foregoing. In some embodiments, the buffer layer 704 is or comprises the same semiconductor material as the sacrificial substrate 706, has the same doping type as the sacrificial substrate 706, has a different doping concentration than the sacrificial substrate 706, or any combination of the foregoing. For example, the sacrificial substrate 706 may be or comprise P+ monocrystalline silicon, whereas the buffer layer 704 may be or comprise P− monocrystalline silicon. In some embodiments, the buffer layer 704 has the same doping type, the same doping concentration, the same resistivity, or any combination of the foregoing as the handle substrate (102 of FIG. 6).

In some embodiments, a process for forming the buffer layer 704 comprises growing the buffer layer 704 on the sacrificial substrate 706 by molecular beam epitaxy (MBE), vapor phase epitaxy (VPE), liquid phase epitaxy (LPE), some other epitaxial process, or any combination of the foregoing. In such embodiments, the sacrificial substrate 706 serves as a seed layer for the epitaxy. Alternatively, in some embodiments, the buffer layer 704 is formed by doping a top portion of the sacrificial substrate 706, such that the top portion defines the buffer layer 704. For example, supposing the sacrificial substrate 706 is or comprises P+ silicon, the top portion of the sacrificial substrate 706 may be counter doped with n-type dopants, such that the top portion, and hence the buffer layer 704, are or comprise P− silicon.

Also illustrated by the cross-sectional view 700 of FIG. 7, an etch stop layer 702 and a device layer 106 are formed stacked over the buffer layer 704, such that the device layer 106 overlies the etch stop layer 702. The etch stop layer 702 and the device layer 106 are crystalline materials with different crystalline lattices. In some embodiments, the etch stop layer 702 is or comprises silicon germanium, silicon carbide, silicon, some other crystalline material, or any combination of the foregoing, and/or is doped with boron, aluminum, some other p-type dopant, or any combination of the foregoing. For example, the etch stop layer 702 may be or comprise intrinsic (i.e., undoped) silicon germanium, boron-doped silicon germanium, or boron-doped elemental silicon. In some embodiments in which the etch stop layer 702 is or comprises silicon germanium, an atomic percent of germanium in the etch stop layer 702 is approximately 20-60%, approximately 20-40%, approximately 40-60%, or approximately 22-55%. For example, the etch stop layer 702 may be or comprise $Si_xGe_{1-x}$, where x is approximately 0.2-0.6, approximately 0.2-0.4, or approximately 0.4-0.6.

If the atomic percent of germanium in the etch stop layer 702 is too high (e.g., greater than approximately 50%, 60%, or some other suitable percent), the device layer 106 may poorly form on the etch stop layer 702. For example, the crystalline lattice of the device layer 106 may form with a high concentration of crystalline defects, thereby leading to leakage current in devices subsequently formed on the device layer 106.

In some embodiments, the device layer 106 is or comprises monocrystalline silicon, some other semiconductor material, or any combination of the foregoing. In some embodiments, the device layer 106 is or comprises the same semiconductor material as the handle substrate (102 of FIG. 6) and/or the sacrificial substrate 706. In some embodiments, the device layer 106 has a resistance less than approximately 8, 15, or 20 Ω/cm and/or between approximately 8-20 Ω/cm, approximately 8-14 Ω/cm, or approximately 14-20 Ω/cm. In some embodiments, the resistance of the device layer 106 is the same or approximately the same as that of the handle substrate (102 of FIG. 6). In other embodiments, the resistance of the device layer 106 is low (e.g., one, two, or more orders of magnitude less) compared to that of the handle substrate (102 of FIG. 6).

In some embodiments, the etch stop layer 702 and the device layer 106 are formed by epitaxy. For example, the etch stop layer 702 and the device layer 106 may each be formed by MBE, VPE, LPE, some other epitaxial process, or any combination of the foregoing. In some embodiments, the buffer layer 704 serves as a seed layer for the etch stop layer 702, and/or the etch stop layer 702 serves as a seed layer for the device layer 106.

Figure 8:
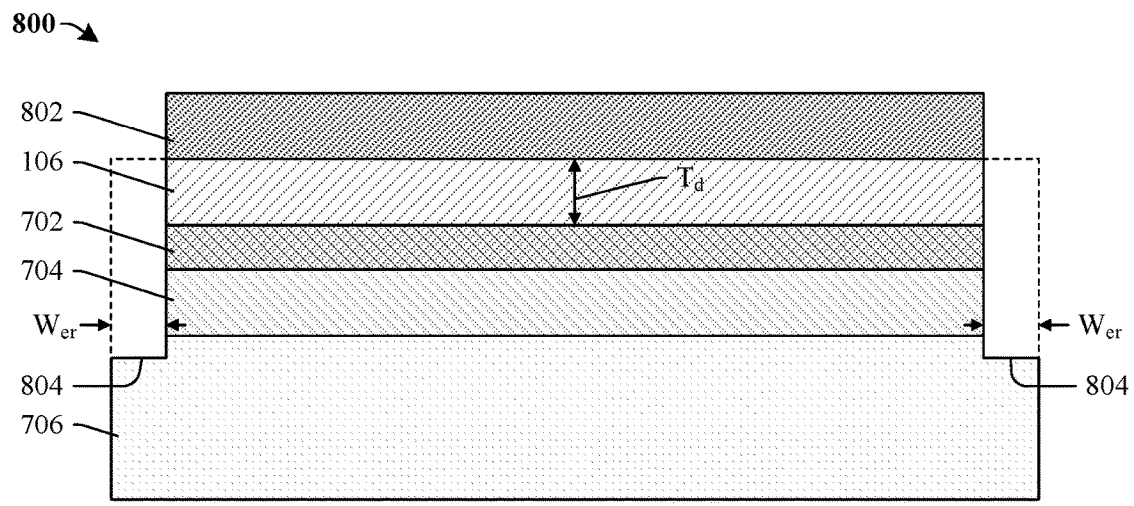

As illustrated by the cross-sectional view 800 of FIG. 8, the device layer 106, the etch stop layer 702, the buffer layer 704, and the sacrificial substrate 706 are patterned to remove edge portions (710 of FIG. 7). By removing the edge portions (710 of FIG. 7), defects are prevented from forming at the edge portions (710 of FIG. 7) during subsequent grinding and/or wet etching. The edge defects have a propensity to concentrate at the edge portions (710 of FIG. 7) and negatively impact the quality of the device layer 106. Further, the patterning forms a ledge 804 at an edge of the sacrificial substrate 706. The ledge 804 is defined by the sacrificial substrate 706 and has a pair of ledge segments respectively on opposite sides of the sacrificial substrate 706. In some embodiments, the ledge 804 has a width $W_{er}$ of approximately 0.8-1.2 millimeters, approximately 0.8-1.0 millimeters, or approximately 1.0-1.2 millimeters.

In some embodiments, the patterning is performed by a photolithography/etching process or some other patterning process. Further, in some embodiments, the patterning comprises: 1.) forming a mask 802 over the device layer 106, 2.) performing an etch into the device layer 106, the etch stop layer 702, the buffer layer 704, and the sacrificial substrate 706 with the mask 802 in place; 3.) and removing the mask 802 (not shown). In some embodiments, the mask 802 is or comprise silicon nitride, silicon oxide, some other hard mask material, photoresist, some other mask material, or any combination of the foregoing. In some embodiments, the mask 802 is formed using a wafer edge exposure (WEE) process tool. For example, a process for forming the mask 802 may comprise: 1.) depositing a photoresist layer on the device layer 106; 2.) selectively exposing an edge portion of the photoresist layer to radiation using the WEE process tool; 3.) and developing the photoresist layer to form the mask 802.

Figure 9:
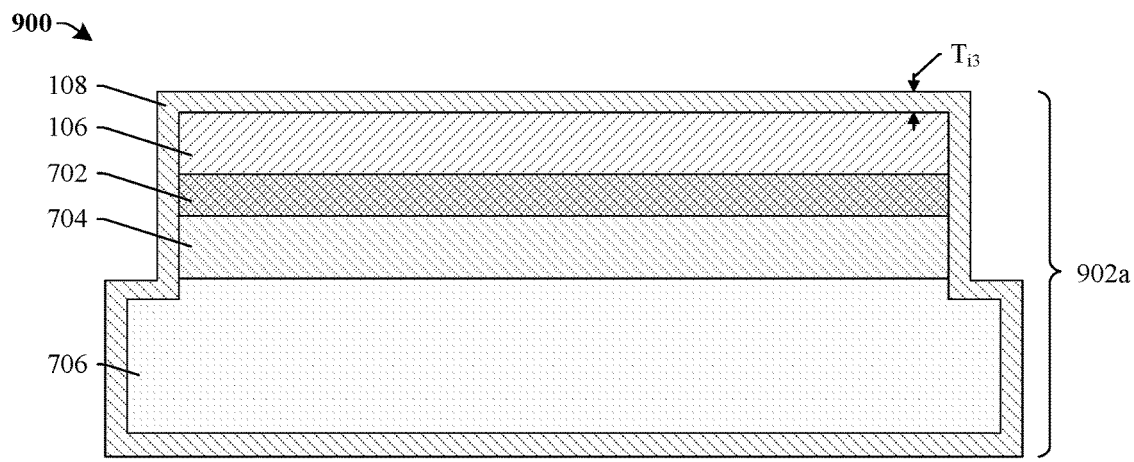

As illustrated by the cross-sectional view 900 of FIG. 9, a second insulator layer 108 is formed on the device layer 106, the etch stop layer 702, the buffer layer 704, and the sacrificial substrate 706 defining a first device wafer 902a. In some embodiments, the second insulator layer 108 completely encloses the device layer 106, the etch stop layer 702, the buffer layer 704, and the sacrificial substrate 706.

The second insulator layer 108 may, for example, be or comprise a second material such as a high κ dielectric, aluminum oxide (e.g., $Al_2O_3$), or the like. In some embodiments, the second insulator layer 108 is not or does not comprise silicon oxide. For example, in some embodiments, the first and second material are both $Al_2O_3$ formed with the same deposition process. In various embodiments, the first and second materials each has an electrical resistivity, a thermal conductivity, and a bandgap comparable to silicon oxide. In various embodiments, the second insulator layer 108 is formed to a thickness $T_{i3}$ of approximately 20 nm or 15 nm, or is formed within a range of approximately 0.1-15 nm or approximately 0.1-20 nm. In some embodiments, the thickness $T_{i3}$ of the second insulator layer 108 is approximately equal to that of the first insulator layer (104 of FIG. 6). In various embodiments, the second insulator layer 108 is formed with uniform thickness $T_{i3}$ around an outer perimeter of the device layer 106. In some embodiments, a variation of the thickness $T_{i3}$ of the second insulator layer 108 around the outer perimeter of the device layer 106 is less than approximately 2 percent.

In some embodiments, a process for forming the second insulator layer 108 comprises depositing the second insulator layer 108 by thermal oxidation, chemical vapor deposition (CVD), physical vapor deposition (PVD), atomic layer deposition (ALD) some other deposition process, or any combination of the foregoing. For example, the second insulator layer 108 may be formed at temperatures of approximately 300 degrees Celsius, 450 degrees Celsius, and/or less than 450 degrees Celsius. For example, where the second insulator layer 108 is formed by an ALD process, the second insulator layer 108 may be formed at these temperatures. When the second insulator layer 108 is formed by the ALD process at those temperatures, a TTV of the second insulator layer 108 is low. The TTV may, for example, be the difference between a smallest thickness value across the second insulator layer 108 and a largest thickness value across the second insulator layer 108. A low TTV, for example, may correspond to less than a two percent variation in TTV across the outer surface of the second insulator layer 108. In some embodiments in which the etch stop layer 702 is or comprises silicon germanium, forming the second insulator 108 at these temperatures ensures dislocation does not occur between the etch stop layer 702 and the device layer 106 and/or between the etch stop layer 702 and the buffer layer 704.

Figure 10A:
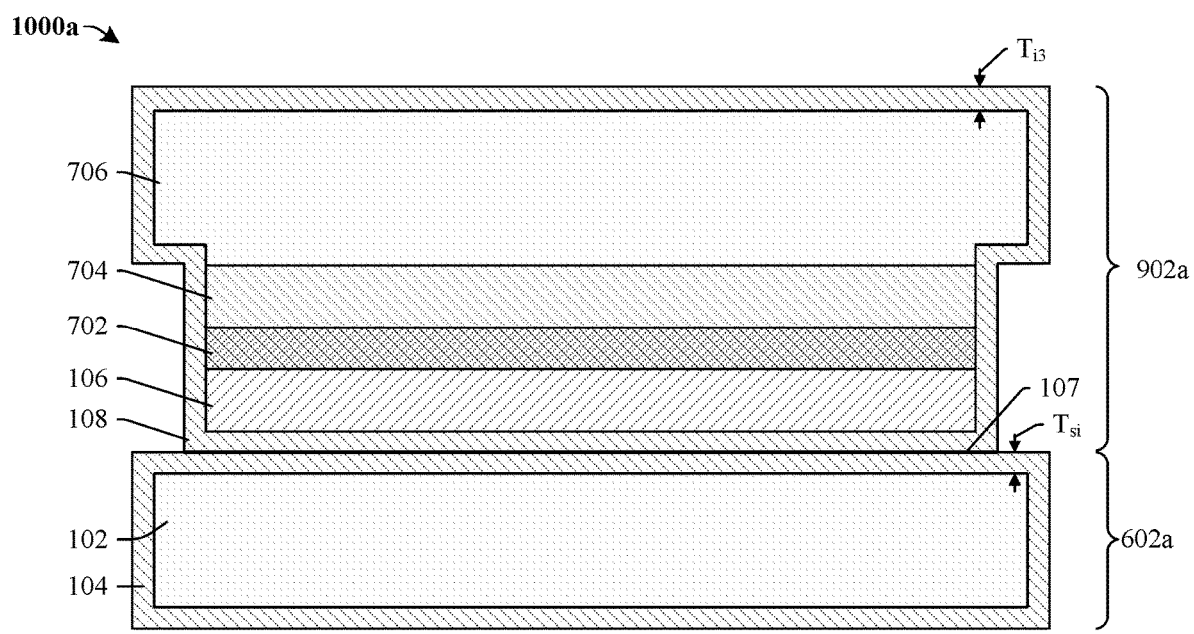

As illustrated by the cross-sectional view 1000a of FIG. 10A, the first device wafer (902a of FIG. 9) is flipped vertically and bonded to the first handle wafer 602a such that the device layer 106, the etch stop layer 702, the buffer layer 704, the first insulator layer 104, and the second insulator layer 108 are between the handle substrate 102 and the sacrificial substrate 706. The bonding may, for example, be performed by fusion bonding, vacuum bonding, or some other bonding process. The fusion bonding may, for example, be performed with a pressure of approximately 1 standard atmosphere (atm), and/or the vacuum bonding may, for example, be performed at a pressure of approximately 0.1-30 millibars (mBar).

In some embodiments, a bond anneal is performed to strengthen the bond. In some embodiments, the bond anneal is performed at a temperature of approximately 300-400° C., approximately 300-350° C., approximately 350-400° C., or approximately 350° C. In some embodiments, the bond anneal is performed for approximately 1-3 hours, approximately 1-2 hours, approximately 2-3 hours, or approximately 2 hours.

The first and second insulator layers 104, 108 directly contact at a bond interface 107 such that material of the first insulator layer 104 is bonded to material of the second insulator layer 108. The bond interface 107 comprises a high κ-high κ bond between the first and second insulator layers 104, 108. In various embodiments, the high κ-high κ bond is an $Al_2O_3$—$Al_2O_3$ bond. In some embodiments, the bond interface 107 is absent of any voids. In various embodiments, the bond interface 107 has a strong interfacial adhesion energy that is at least four times greater than an interfacial adhesion energy of a silicon oxide-silicon oxide bond. In various embodiments, the strong interfacial adhesion energy of the bond interface 107 is approximately 12 $J/m^2$.

Figure 10B:
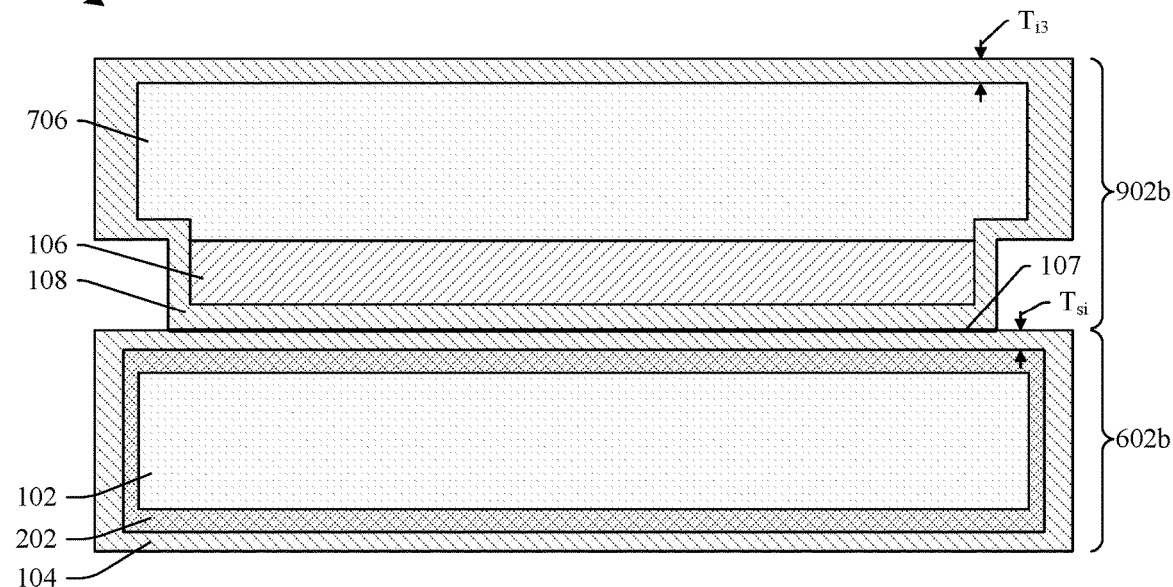

Referring to FIG. 10B, the cross-sectional view 1000b in accordance with some alternative embodiments of the cross-sectional view 1000a of FIG. 10A is provided in which a second device wafer 902b is bonded (according to the bond and bond anneal of FIG. 10A) to a second handle wafer 602b. The second device wafer 902b may, for example, be formed as the first device wafer (902a of FIG. 9) is illustrated and described, except that the etch stop layer (702 of FIG. 7) and the buffer layer (704 of FIG. 7) are not formed. The device layer 106 is formed directly on the sacrificial substrate 706 before performing the patterning of FIG. 8. The second handle wafer 602b may, for example, be formed as the first handle wafer (602a of FIG. 6) is illustrated and described, except that a bottom dielectric layer 202 is formed on the handle substrate 102 before forming the first insulator layer 104.

Figure 10C:
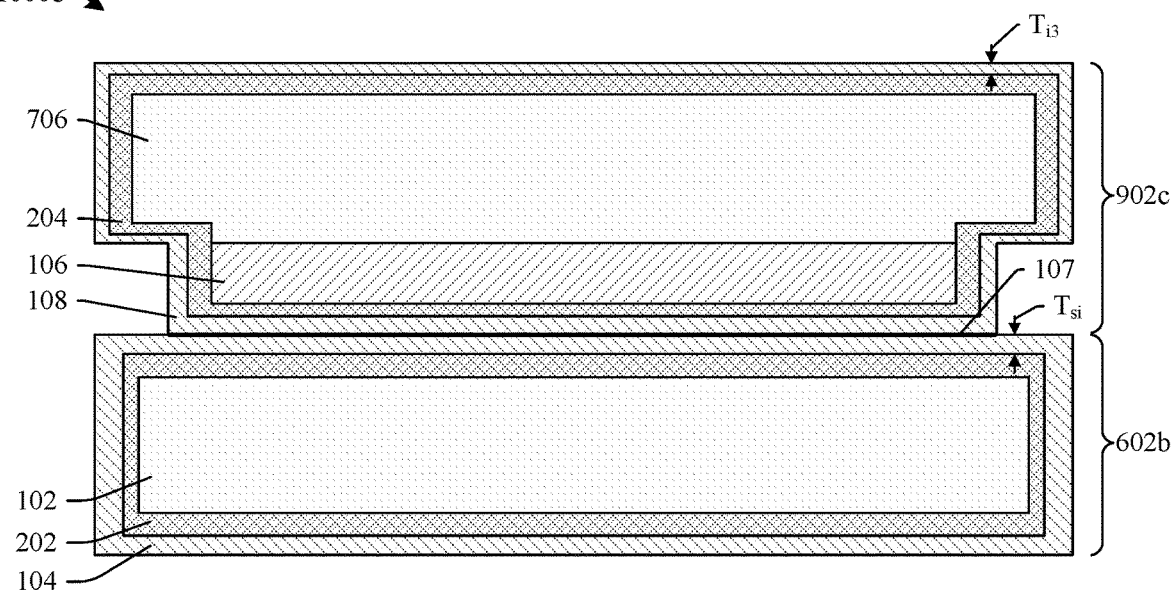

Referring to FIG. 10C, the cross-sectional view 1000c in accordance with some alternative embodiments of the cross-sectional view 1000a of FIG. 10A is provided in which a third device wafer 902c is bonded (according to the bond and bond anneal of FIG. 10A) to the second handle wafer 602b. The third device wafer 902c may, for example, be formed as the first device wafer (902a of FIG. 9) is illustrated and described, except that the etch stop layer 702 and the buffer layer 704 are not formed. The device layer 106 is formed directly on the sacrificial substrate 706 before performing the patterning of FIG. 8. A top dielectric layer 204 is formed on the device layer 106 and the sacrificial substrate 706 before forming the second insulator layer 108. The second handle wafer 602b may, for example, be formed as the first handle wafer (602a of FIG. 6) is illustrated and described, except that a bottom dielectric layer 202 is formed on the handle substrate 102 before forming the first insulator layer 104.

Figure 10D:
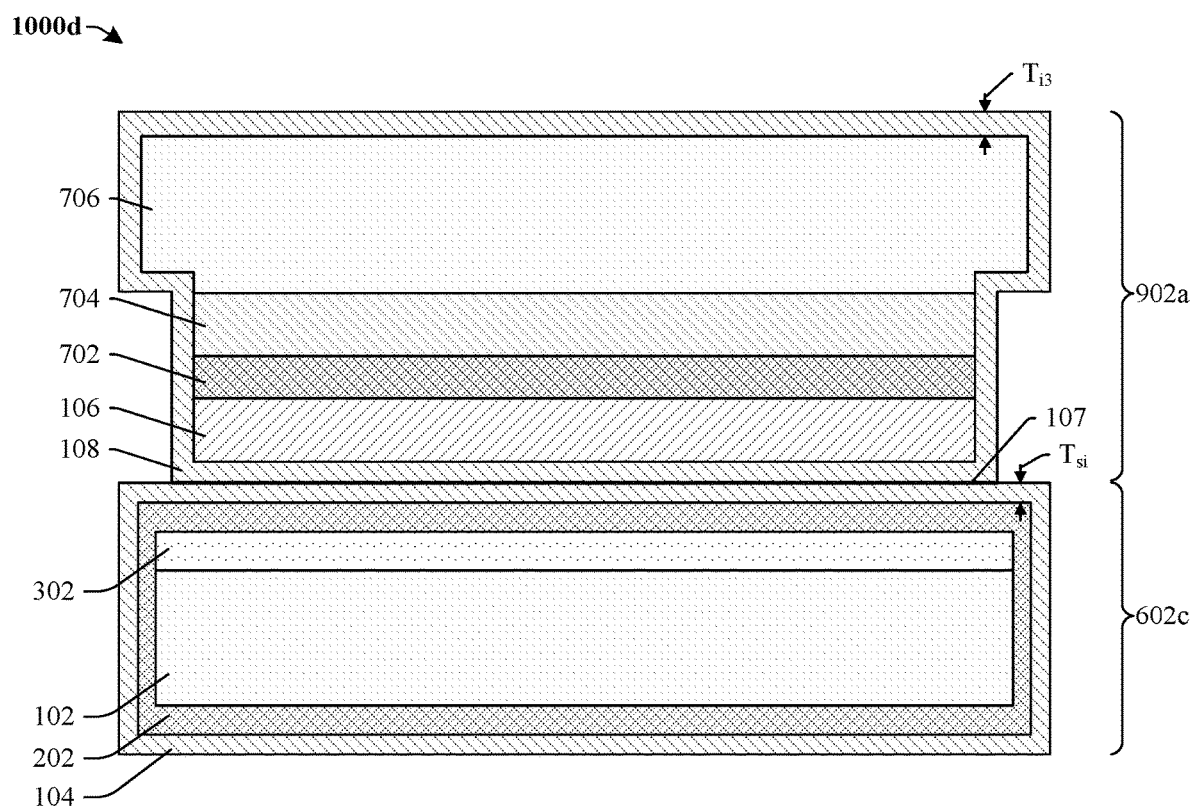

Referring to FIG. 10D, the cross-sectional view 1000d in accordance with some alternative embodiments of the cross-sectional view 1000a of FIG. 10A is provided in which the first device wafer 902a is bonded (according to the bond and bond anneal of FIG. 10A) to a third handle wafer 602c. The third handle wafer 602c may, for example, be formed as the first handle wafer (602a of FIG. 6) is illustrated and described, except that a trap-rich layer 302 (or a polysilicon layer) is formed over the handle substrate 102 and a bottom dielectric layer 202 is formed on the handle substrate 102 and the trap-rich layer 302 before forming the first insulator layer 104.

Figure 10E:
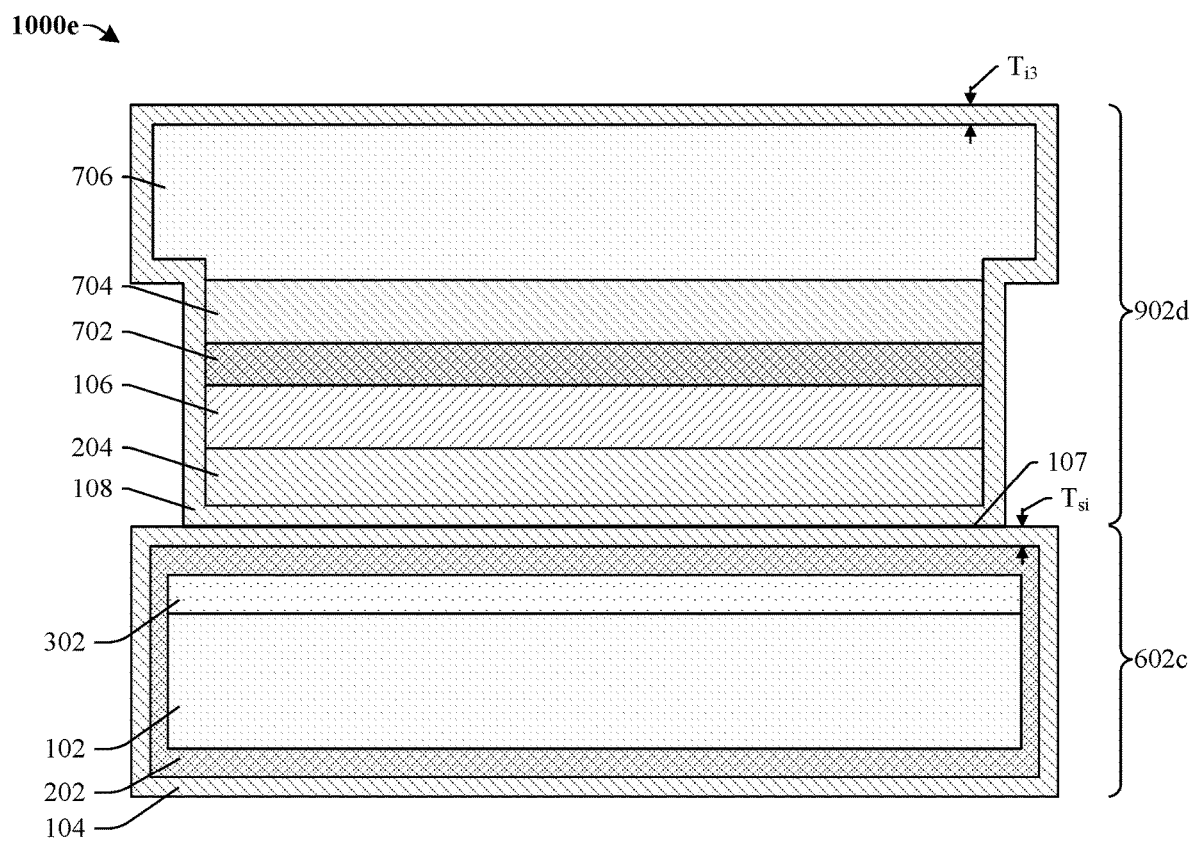

Referring to FIG. 10E, the cross-sectional view 1000e in accordance with some alternative embodiments of the cross-sectional view 1000d of FIG. 10D is provided in which a fourth device wafer 902d is bonded (according to the bond and bond anneal of FIG. 10A) to the third handle wafer 602c. The fourth device wafer 902d may, for example, be formed as the first device wafer (902a of FIG. 10A) and further includes a top dielectric layer 204 formed between a lower surface of the device layer 106 and a lower inner surface of the second insulator layer 108. The third handle wafer 602c may, for example, be formed as the first handle wafer (602a of FIG. 6) is illustrated and described, except that a trap-rich layer 302 (or a polysilicon layer) is formed over the handle substrate 102 and a bottom dielectric layer 202 is formed on the handle substrate 102 and the trap-rich layer 302 before forming the first insulator layer 104.

In some embodiments when the device layer 106 is equal to/less than approximately 100 nm, the top dielectric layer 204 is formed over the device layer 106 before forming the second insulator layer 108. The top dielectric layer 204 moves the bond interface 107 away from the device layer 106. The top dielectric layer 204 may, for example, prevent particles on the surface of the device layer 106 from causing humps and/or bond bubbling between the first and second insulator layers 104, 108 while forming the bond interface 107. In some embodiments, increasing the thickness of the device layer 106 to approximately greater than 200 nm may, for example, prevent the particles on the surface of the device layer 106 from causing hump and/or bond bubbling in the bond interface 107.

Figure 11:
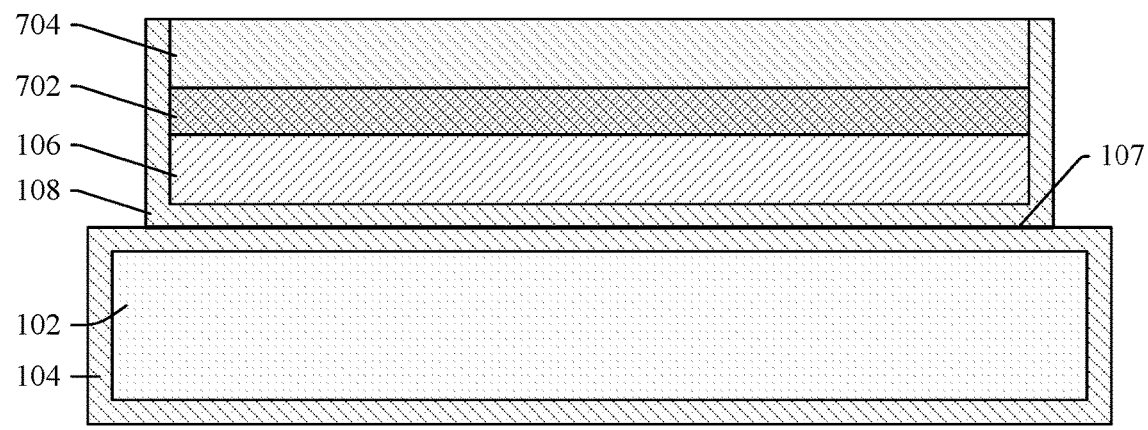

As illustrated by the cross-sectional view 1100 of FIG. 11, a first removal process is performed on the first device wafer (902a of FIG. 10A) to remove the sacrificial substrate (706 of FIG. 10A). Further, the first removal process removes an upper portion of the second insulator layer 108. In some embodiments, the first removal process includes first performing a first thinning process, then performing a first etch process.

In some embodiments, the first thinning process removes a portion of the sacrificial substrate (706 of FIG. 10A). In some embodiments, the first thinning process is performed by a mechanical grinding process, a chemical mechanical polish (CMP), some other thinning process, or any combination of the foregoing. For example, the first thinning process may be performed wholly by a mechanical grinding process. The first etch may, for example, be performed by a HNA etchant, some other wet etchant, a dry etchant, or some other etchant. The HNA etchant may, for example, be or comprise a chemical solution comprising hydrofluoric acid, nitric acid, and acetic acid. In some embodiments, a cleaning process may be performed after each patterning, thinning, and/or etch process(es). The cleaning process(es) may, for example, comprise DHF, the first and second insulator layers 104, 108 and the high adhesion energy of the bond interface 107 resist damage from the DHF.

The high κ material of the first and second insulator layers 104, 108 mitigates damage to interfaces of the first and second insulator layers 104, 108 such that the interfaces are not damaged and/or affected by the first removal process or any subsequent processing steps (e.g., from any thinning process and/or etch processes that utilize HF and/or HNA, or from any cleaning process(es) that comprise DHF). For example, the high κ material of the first and second insulator layers 104, 108 protect against the HNA etchant of the first etch. Additionally, the strong interfacial adhesion energy of the bond interface 107 prevents damage to the bond interface 107 from the first removal process. For example, voids do not occur in the bond interface 107 due to the HNA etchant of the first etch. Further, for example, the bond interface 107 is not damaged and/or affected by any subsequent processing steps.

Figure 12:
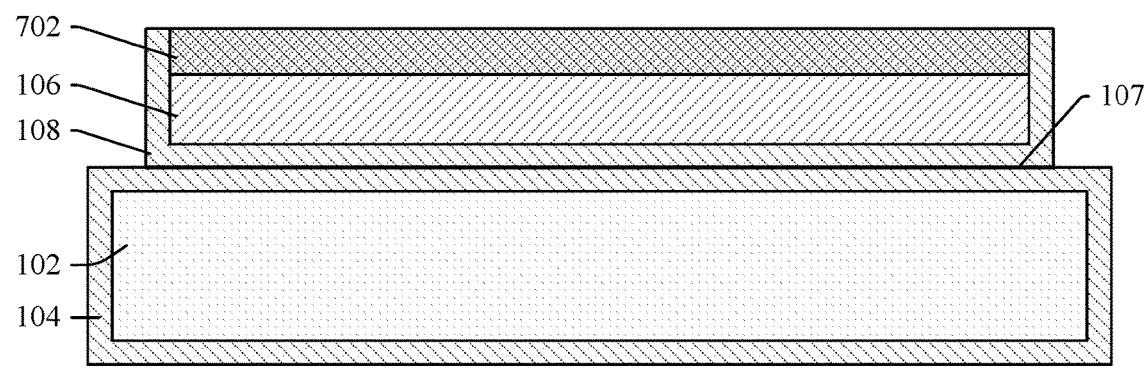

As illustrated by the cross-sectional view 1200 of FIG. 12, a second removal process is performed to remove the buffer layer (704 of FIG. 1). Further, the second removal process removes an upper portion of the second insulator layer 108. In some embodiments, the second removal process includes first performing a second thinning process, then performing a second etch process.

The second thinning process may, for example, be performed by a CMP, some other suitable thinning process, or any combination of the foregoing. The second etch may, for example, be performed by a DHF etchant, an HF etchant, some other wet etchant, a dry etchant, or some other etchant. The HNA etchant may, for example, be or comprise a chemical solution comprising hydrofluoric acid, nitric acid, and acetic acid.

Figure 13:
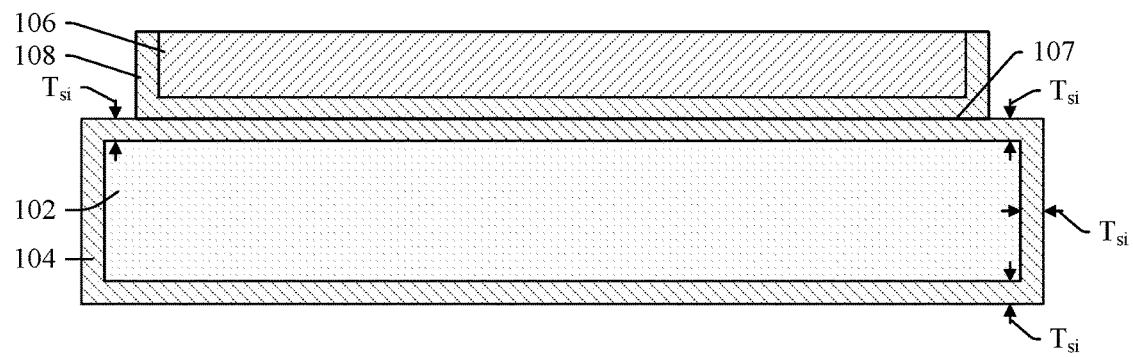

As illustrated by the cross-sectional view 1300 of FIG. 13, a third etch is performed to remove the etch stop layer (702 of FIG. 12). Further, the third etch removes an upper portion of the second insulator layer 108.

While FIGS. 11-13 are described with regards to embodiments of the cross-sectional view 1000a in FIG. 10A, it is to be understood that embodiments of the cross-sectional views 1000b-1000e in FIGS. 10B-10E may alternatively be used in FIGS. 11-13. While FIGS. 11-13 illustrates a specific set of removal processes, etch processes, and etch/removal techniques, other sets of removal processes, etch processes, and etch/removal techniques are amenable. For example, removal/etch processes will be utilized to expose an upper surface of the device layer 106 of each device in the cross-sectional views 1000b-1000e in FIGS. 10B-10E. In some embodiments, the cross-sectional view 1000a of FIG. 10A corresponds to the SOI substrate 100c of FIG. 1C by: forming the first insulator layer 104 (of FIG. 10A) over only a top surface of the handle substrate 102 (of FIG. 10A), forming the second insulator layer 108 (of FIG. 10A) over only a bottom surface of the device layer 106 (of FIG. 10A), and employing removal/etch processes to expose an upper surface of the device layer 106 (of FIG. 10A). In some embodiments, the cross-sectional view 1000b of FIG. 10B corresponds to the SOI substrate 200a of FIG. 2A after employing removal/etch processes to expose an upper surface of the device layer 106 (of FIG. 10B). In some embodiments, the cross-sectional view 1000c of FIG. 10C corresponds to the SOI substrate 200c of FIG. 2C after employing removal/etch processes to expose an upper surface of the device layer 106 (of FIG. 10C). In some embodiments, the cross-sectional view 1000b of FIG. 10B corresponds to the SOI substrate 200d of FIG. 2D by: forming the first insulator layer 104 (of FIG. 10B) over only a top surface of the bottom dielectric layer 202 (of FIG. 10B), forming the second insulator layer 108 (of FIG. 10B) over only a bottom surface of the device layer 106 (of FIG. 10B), and employing removal/etch processes to expose an upper surface of the device layer 106 (of FIG. 10B). In some embodiments, the cross-sectional view 1000d of FIG. 10D corresponds to the SOI substrate 300a of FIG. 3A after employing removal/etch processes to expose an upper surface of the device layer 106 (of FIG. 10D). In some embodiments, the cross-sectional view 1000e of FIG. 10E corresponds to the SOI substrate 300c of FIG. 3C after employing removal/etch processes to expose an upper surface of the device layer 106 (of FIG. 10E). In some embodiments, the cross-sectional view 1000d of FIG. 10D corresponds to the SOI substrate 300d of FIG. 3D by: forming the first insulator layer 104 (of FIG. 10D) over only a top surface of the bottom dielectric layer 202 (of FIG. 10D), forming the second insulator layer 108 (of FIG. 10D) over only a bottom surface of the device layer 106 (of FIG. 10D), and employing removal/etch processes to expose an upper surface of the device layer 106 (of FIG. 10D). Additionally, while the acts hereafter described at FIGS. 14-16 are performed on the SOI substrate at FIG. 13, the acts may be performed on the SOI substrate resulting from the above described etch/removal process(es) to the semiconductor structures at FIGS. 10B-10E.

Figure 14:
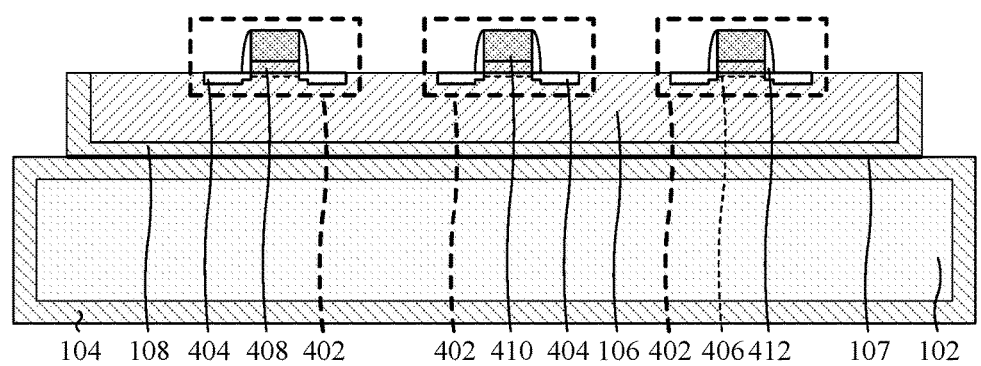

As illustrated by the cross-sectional view 1400 of FIG. 14, a plurality of semiconductor devices 402 are formed on the device layer 106. The semiconductor devices 402 may, for example, be as described with regard to FIG. 4 and/or may, for example, be MOSFETs, some other MOS devices, some other IGFETs, some other suitable semiconductor devices, or any combination of the foregoing. Further, the semiconductor devices 402 may, for example, be fully-depleted or partially-depleted semiconductor devices.

In some embodiments, a process for forming the semiconductor devices 402 comprises depositing a gate dielectric layer and a conductive layer over the device layer 106, and subsequently patterning (e.g., by photolithography) the dielectric layer and the conductive layer into gate electrodes 410 and gate dielectric layers 408. For ease of illustration, only one of the gate electrodes 410 is labeled 410, and only one of the gate dielectric layers 408 is labeled 408. The device layer 106 is doped (e.g., by ion implantation or some other doping process) to define source/drain regions 404 bordering sidewalls of the gate electrodes 410. For ease of illustration, only one of the source/drain regions 404 is labeled 404. In some embodiments, before forming the semiconductor devices 402, isolation structures are formed extending through the device layer 106 to the second insulator layer 108.

Figure 15:
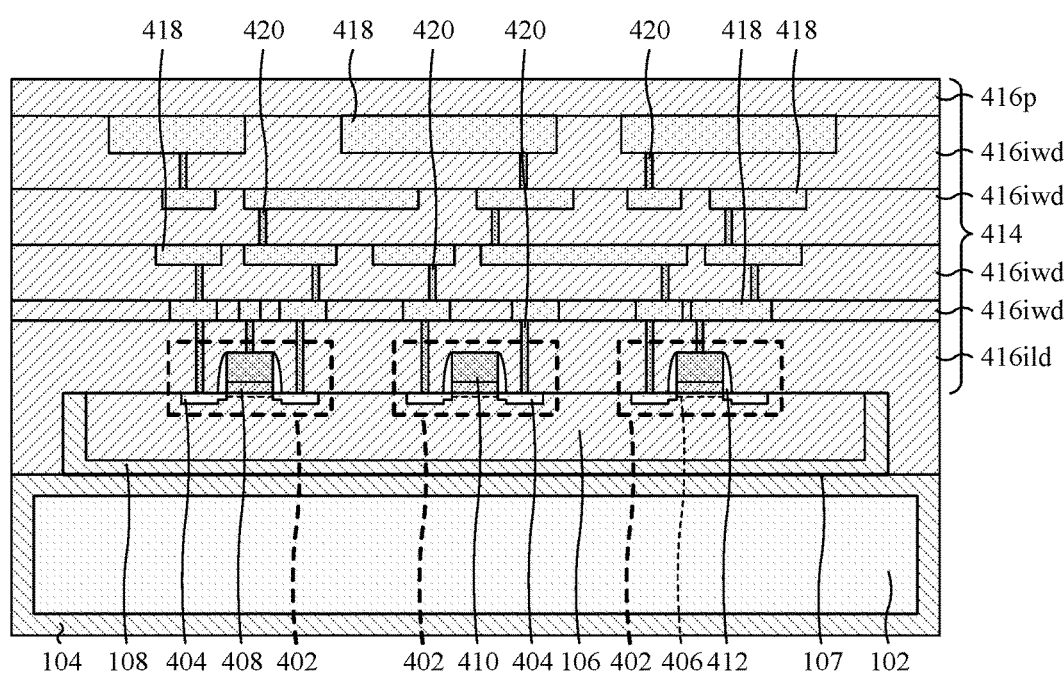
Figure 16:
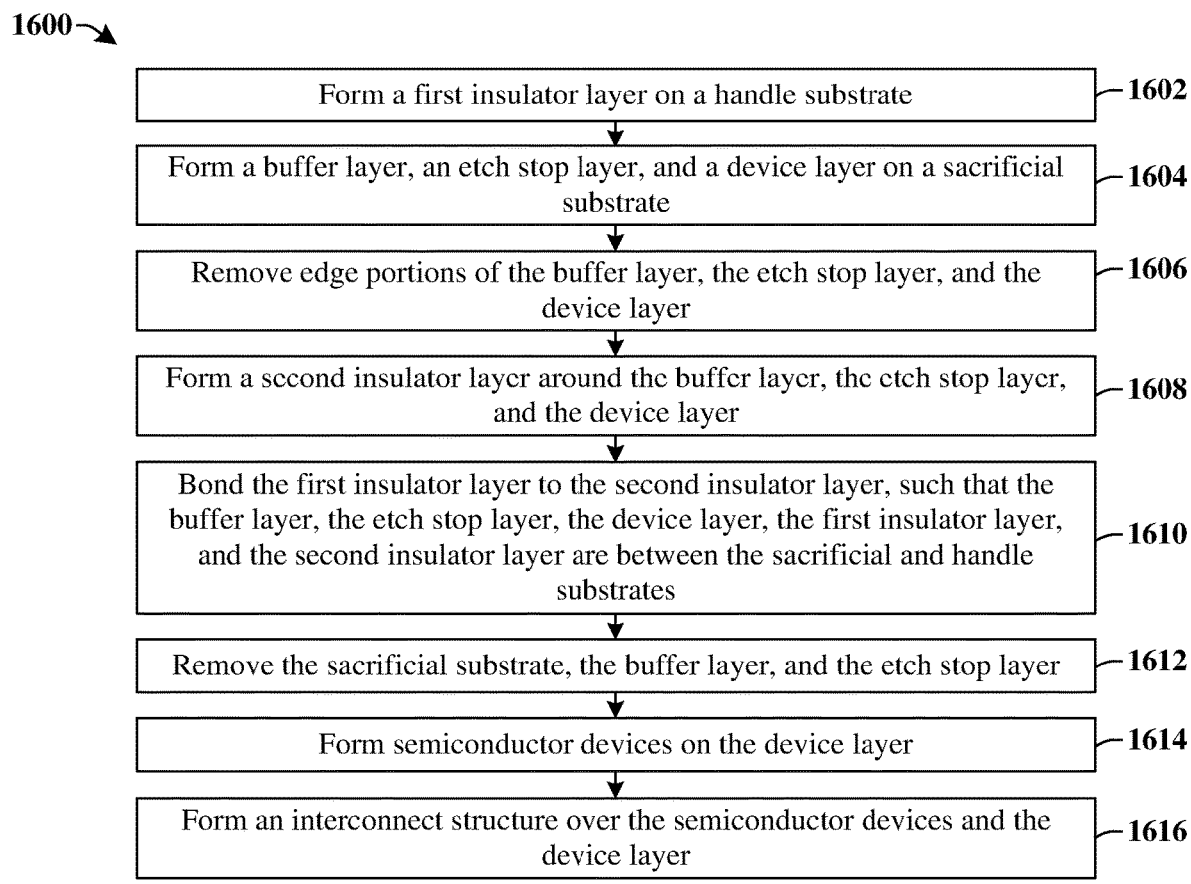
FIG. 16 illustrates a block diagram of some embodiments of the method of FIGS. 6-9, 10A-10E, and 11-15, according to the present disclosure.

As illustrated by the cross-sectional view 1500 of FIG. 15, a BEOL interconnect structure 414 is formed over the device layer 106 and the semiconductor devices 402. The BEOL interconnect structure 414 comprises an interconnect dielectric layer, a plurality of wires 418, and a plurality of vias 420. For ease of illustration, only some of the wires 418 are labeled 418, and only some of the vias 420 are labeled 420. The interconnect dielectric layer comprises an interlayer dielectric (ILD) layer 416$ild$, a plurality of interwire dielectric (IWD) layers 416$iwd$, and a passivation layer 416$p$. The IWD layers 416$iwd$ are stacked over the ILD layer 416$ild$, and the passivation layer 416$p$ is over the IWD layers 416$iwd$. The ILD layer 416$ild$, the IWD layers 416$iwd$, and the passivation layer 416$p$ may be or comprise, for example, BPSG, PSG, USG, some other low κ dielectric, silicon oxide, some other dielectric, or any combination of the foregoing. The wires 418 and the vias 420 are alternatingly stacked in the interconnect dielectric layer defined by the ILD layer 416$ild$, the IWD layers 416$iwd$, and the passivation layer 416$p$.

In some embodiments, a process for forming the BEOL interconnect structure 414 comprises forming a bottommost layer of the vias 420 by a single damascene process, and subsequently forming a bottommost layer of the wires 418 by the single damascene process. Further, in some embodiments, the process comprises forming remaining layers of the vias 420 and remaining layers of the wires 418 by repeatedly performing a dual damascene process. In some embodiments, the single damascene process comprises depositing a dielectric layer, patterning the dielectric layer with openings for a single layer of conductive features (e.g., a layer of vias or wires), and filling the openings with conductive material to form the single layer of conductive features. The dielectric layer may, for example, correspond to the ILD layer 416$ild$ or a bottom IWD layer of the IWD layers 416$iwd$. In some embodiments, the dual damascene process comprises depositing a dielectric layer, patterning the dielectric layer with openings for two layers of conductive features (e.g., a layer of vias and a layer of wires), and filling the openings with conductive material to form the two layers of conductive features. The dielectric layer may, for example, correspond to one of the IWD layers 416$iwd$ over the bottom IWD layer.

The high κ material of the first and second insulator layers 104, 108 and the strong interfacial adhesion energy of the bond interface 107 mitigates damage to interfaces of the first and second insulator layers 104, 108 such that the interfaces are not damaged and/or affected by the first removal process of FIG. 11, the second removal process of FIG. 12, the third etch of FIG. 13, the formation of the plurality of semiconductor devices (402 of FIG. 14), and the formation of the BEOL interconnect structure (414 of FIG. 15) (e.g., from any thinning process and/or etch processes that utilize HF and/or HNA, or from any cleaning process(es) that comprise DHF). For example, the high κ material of the first and second insulator layers 104, 108 protect against the HNA etchant of the first etch. Additionally, the strong interfacial adhesion energy of the bond interface 107 prevents damage to the bond interface 107 from the first etch. For example, voids do not occur in the bond interface 107 due to the HNA etchant of the first etch. Further, for example, the interfaces of the first and second insulator layers 104, 108 are not damaged and/or affected by any subsequent processing steps.

FIG. 16 illustrates a method 1600 of forming an SOI substrate with a first high κ bonding structure and a second high κ bonding structure according to the present disclosure. Although the method 1600 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 1602, a first insulator layer is formed on a handle substrate. FIG. 6 illustrates a cross-sectional view 600 corresponding to some embodiments of act 1602.

At 1604, a buffer layer, an etch stop layer, and a device layer are formed on a sacrificial substrate. FIG. 7 illustrates a cross-sectional view 700 corresponding to some embodiments of act 1604.

At 1606, edge portions of the buffer layer, the etch stop layer, and the device layer are removed. FIG. 8 illustrates a cross-sectional view 800 corresponding to some embodiments of act 1606.

At 1608, a second insulator layer is formed around the buffer layer, the etch stop layer, and the device layer. FIG. 9 illustrates a cross-sectional view 900 corresponding to some embodiments of act 1608.

At 1610, the first insulator layer is bonded to the second insulator layer, such that the buffer layer, the etch stop layer, the device layer, the first insulator layer, and the second insulator layer are between the sacrificial and handle substrates. FIG. 10A illustrates a cross-sectional view 1000$a$ corresponding to some embodiments of act 1610.

At 1612, the sacrificial substrate, the buffer layer, and the etch stop layer are removed. FIGS. 11-13 illustrate cross-sectional views 1100-1300 corresponding to some embodiments of act 1612.

At 1614, semiconductor devices are formed on the device layer. FIG. 14 illustrates a cross-sectional view 1400 corresponding to some embodiments of act 1614.

At 1616, an interconnect structure is formed over the semiconductor devices and the device layer. FIG. 15 illustrates a cross-sectional view 1500 corresponding to some embodiments of act 1616.

Accordingly, in some embodiments, the present application relates to a SOI device that comprises a first high κ insulator layer surrounding a device layer and a second high κ insulator layer surrounding a handle substrate, the first high κ insulator layer is bonded to the second high κ insulator.

In some embodiments, the present application provides a method for forming a SOI substrate, the method including: forming a first high κ bonding structure over a handle substrate; forming a device layer over a sacrificial substrate, wherein outer most sidewalls of the device layer are between outer most sidewalls of the sacrificial substrate; forming a second high κ bonding structure over the device layer; bonding the first high κ bonding structure to the second high κ bonding structure, such that the device layer is between the sacrificial substrate and the handle substrate; and performing a first removal process to remove the sacrificial substrate, wherein the first removal process comprises performing a first etch into the sacrificial substrate until the device layer is reached.

In some embodiments, the present application provides a SOI substrate including: a handle substrate underlying a first dielectric structure; and a device layer overlying a second dielectric structure, wherein a lower surface of the second dielectric structure is bonded to an upper surface of the first dielectric structure at a bond interface, and wherein the first and second dielectric structures are respectively comprised of a high κ material.

In some embodiments, the present application provides an integrated circuit (IC) including: a semiconductor-on-insulator (SOI) substrate including a handle substrate underlying a first dielectric structure, wherein the first dielectric structure has a uniform thickness along a top side of the handle substrate; the SOI substrate further including a device layer overlying a second dielectric structure, wherein a lower surface of the second dielectric structure is bonded to an upper surface of the first dielectric structure, wherein the first and second dielectric structures are comprised of a first material with a first dielectric constant, wherein the first dielectric constant is greater than 3.9; and a plurality of transistors disposed within and over the SOI substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor-on-insulator (SOI) substrate comprising:
    a handle substrate underlying a first dielectric structure, wherein the first dielectric structure is a single continuous layer;
    a device layer overlying a second dielectric structure, wherein a lower surface of the second dielectric structure is bonded to and directly contacts an upper surface of the first dielectric structure at a bond interface, wherein the first and second dielectric structures are respectively comprised of aluminum oxide, wherein the bond interface has an interfacial adhesion energy at least four times greater than a silicon oxide-silicon oxide bond interface; and
    wherein the first dielectric structure has a first thickness in a center region directly under the second dielectric structure and a second thickness defined in a peripheral region that is laterally offset from outer sidewalls of the second dielectric structure, wherein the second thickness is greater than zero and is less than the first thickness.

2. The SOI substrate according to claim 1, wherein a third thickness of the second dielectric structure disposed along a bottom surface of the device layer is non-zero and less than the first thickness.

3. The SOI substrate according to claim 1, wherein the second dielectric structure is a single continuous layer.

4. The SOI substrate according to claim 1, wherein the interfacial adhesion energy of the bond interface is approximately 12 J/m$^2$ or greater.

5. The SOI substrate according to claim 1, wherein an upper surface of the device layer is coplanar with an upper surface of the second dielectric structure.

6. The SOI substrate according to claim 1, wherein the handle substrate is completely enclosed in a first buried dielectric structure having a dielectric constant less than that of aluminum oxide, and wherein the first buried dielectric structure is between the handle substrate and the first dielectric structure.

7. The SOI substrate according to claim 6, wherein the first buried dielectric structure has a horizontal thickness disposed along an upper surface of the handle substrate and a vertical thickness disposed along a sidewall of the handle substrate that is less than the horizontal thickness.

8. The SOI substrate according to claim 6, wherein the first buried dielectric structure has a resistivity, thermal conductivity, and bandgap comparable to aluminum oxide.

9. The SOI substrate according to claim 3, wherein the second dielectric structure has a third thickness defined along a lower surface of the device layer, wherein the third thickness is approximately equal to the second thickness.

10. An integrated circuit (IC) comprising:
    a semiconductor-on-insulator (SOI) substrate comprising:
        a handle substrate enclosed in a first dielectric structure, wherein the first dielectric structure is a single continuous layer;
        a device layer overlying and laterally enclosed in a second dielectric structure, wherein a lower surface of the second dielectric structure is bonded to and directly contacts a top surface of the first dielectric structure at a bond interface, wherein the first and second dielectric structures are comprised of aluminum oxide with a first dielectric constant, wherein the first dielectric structure has a first thickness defined between an inner surface of the first dielectric structure and the bond interface and a second thickness defined between the inner surface of the first dielectric structure and an upper surface of the first dielectric structure that is laterally offset from outer sidewalls of the second dielectric structure, wherein the first thickness is greater than the second thickness and the second thickness is non-zero, wherein the upper surface of the first dielectric structure is disposed vertically below the bond interface; and
        a plurality of transistors disposed within and over the SOI substrate.

11. The IC according to claim 10, wherein the plurality of transistors each comprise a gate dielectric layer overlying the device layer, wherein a dielectric constant of each gate dielectric layer is less than the first dielectric constant, and wherein each gate dielectric layer has a comparable resistivity, thermal conductivity, and bandgap to aluminum oxide.

12. The IC according to claim 10, wherein the second dielectric structure is a single continuous layer.

13. The IC according to claim 10, wherein a dielectric layer is disposed between a lower surface of the device layer and a lower inner surface of the second dielectric structure, wherein a dielectric constant of the dielectric layer is less than the first dielectric constant.

14. The IC according to claim 10, wherein a top surface of the device layer is coplanar with a top surface of the second dielectric structure.

15. The IC according to claim 10, wherein a horizontal thickness of the first dielectric structure disposed along a bottom surface of the handle substrate is non-zero and less than the first thickness.

16. The IC according to claim 10, wherein a third thickness of the second dielectric structure is defined between a bottom surface of the device layer and the bond interface, wherein the third thickness is approximately equal to the second thickness.

17. A semiconductor-on-insulator (SOI) substrate comprising:
a first dielectric structure overlying a handle substrate, wherein the first dielectric structure has a low total thickness variation (TTV) along a top surface of the handle substrate, and wherein the first dielectric structure is a single continuous layer;
a device layer overlying the first dielectric structure, wherein the device layer is spaced laterally between opposing sidewalls of the first dielectric structure;
a second dielectric structure disposed between the device layer and the first dielectric structure, wherein the first and second dielectric structures meet at and are in direct contact with one another at a first bond interface such that the first bond interface has an interfacial adhesion energy approximately 12 J/m$^2$ or greater, and wherein the first and second dielectric structures are respectively comprised of aluminum oxide;
a first buried dielectric structure that extends along opposing sidewalls, the top surface, and a bottom surface of the handle substrate, wherein the first buried dielectric structure is disposed between the first dielectric structure and the handle substrate, wherein the first buried dielectric structure comprises a dielectric material; and
wherein the first dielectric structure has an inner thickness in a center region directly under the second dielectric structure and an outer thickness in a peripheral region that is laterally offset from outer sidewalls of the second dielectric structure, wherein the outer thickness is non-zero and is less than the inner thickness.

18. The SOI substrate according to claim 17, wherein a variation of the low TTV along the top surface of the handle substrate is less than approximately 2 percent.

19. The SOI substrate according to claim 17, further comprising:
a polysilicon layer disposed between the top surface of the handle substrate and an inner surface of the first buried dielectric structure, wherein the first buried dielectric structure continuously extends from a top surface of the polysilicon layer, along opposing sidewalls of the polysilicon layer, to the top surface of the handle substrate.

20. The SOI substrate according to claim 17, further comprising:
a second buried dielectric structure disposed between the device layer and the second dielectric structure, wherein the second buried dielectric structure comprises the dielectric material, and wherein the second buried dielectric structure is U-shaped and continuously extends from opposing sidewalls of the device layer to a bottom surface of the device layer.

* * * * *